(12) United States Patent
Choi et al.

(10) Patent No.: US 12,218,175 B2
(45) Date of Patent: Feb. 4, 2025

(54) DISPLAY DEVICE HAVING BANKS WITH AT LEAST TWO AREAS HAVING DIFFERENT WIDTHS

(71) Applicant: SAMSUNG DISPLAY CO., LTD., Yongin-si (KR)

(72) Inventors: Jin Woo Choi, Yongin-si (KR); Eun A Yang, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 689 days.

(21) Appl. No.: 17/282,255

(22) PCT Filed: Apr. 1, 2019

(86) PCT No.: PCT/KR2019/003801
§ 371 (c)(1),
(2) Date: Apr. 1, 2021

(87) PCT Pub. No.: WO2020/071600
PCT Pub. Date: Apr. 9, 2020

(65) Prior Publication Data
US 2021/0343783 A1    Nov. 4, 2021

(30) Foreign Application Priority Data
Oct. 2, 2018 (KR) .......................... 10-2018-0117813

(51) Int. Cl.
*H01L 27/15* (2006.01)
*H01L 33/38* (2010.01)

(52) U.S. Cl.
CPC ............ *H01L 27/156* (2013.01); *H01L 33/38* (2013.01)

(58) Field of Classification Search
CPC .............................. H01L 27/156; H01L 33/38
USPC .......................................................... 257/89
See application file for complete search history.

(56) References Cited

U.S. PATENT DOCUMENTS

| 8,872,214 B2 | 10/2014 | Negishi et al. |
| 9,098,136 B2 | 8/2015 | Kim |
| 9,343,511 B1 | 5/2016 | Feng |
| 9,570,425 B2 | 2/2017 | Do |

(Continued)

FOREIGN PATENT DOCUMENTS

| CN | 108258013 | 7/2018 |
| CN | 108346680 | 7/2018 |

(Continued)

OTHER PUBLICATIONS

International Search Report, with English translation, corresponding to International Application No. PCT/KR2019/003801 dated Jul. 9, 2019.

(Continued)

*Primary Examiner* — Xia L Cross
(74) *Attorney, Agent, or Firm* — KILE PARK REED & HOUTTEMAN PLLC

(57) ABSTRACT

A display deice includes a pair of first color sub-pixels arranged in a display area in a first direction, each of the pair of first color sub-pixels including at least one first color light emitting element, and a bank enclosing the pair of first color sub-pixels. The bank includes at least two areas having different widths in an area corresponding to each of the pair of first color sub-pixels.

23 Claims, 20 Drawing Sheets

(56) References Cited

U.S. PATENT DOCUMENTS

| | | | |
|---|---|---|---|
| 10,446,619 B2* | 10/2019 | Kim | H10K 59/122 |
| 10,461,123 B2 | 10/2019 | Kim et al. | |
| 2016/0133181 A1 | 5/2016 | Nakamura | |
| 2016/0300520 A1* | 10/2016 | Wang | G09F 9/30 |
| 2018/0175106 A1* | 6/2018 | Kim | H01L 33/385 |
| 2018/0287010 A1 | 10/2018 | Sung | |

FOREIGN PATENT DOCUMENTS

| | | |
|---|---|---|
| KR | 10-2014-0036893 | 3/2014 |
| KR | 10-1436123 | 11/2014 |
| KR | 10-1628345 | 6/2016 |
| KR | 10-1666370 | 10/2016 |
| KR | 10-1713818 | 3/2017 |
| KR | 10-2018-0072909 | 7/2018 |
| KR | 10-2018-0076813 | 7/2018 |
| KR | 10-2018-0076820 | 7/2018 |

OTHER PUBLICATIONS

Written Opinion, with English translation, corresponding to International Application No. PCT/KR2019/003801, dated Jul. 9, 2019.
Chinese Office Action for Chinese Patent Application No. 201980064638.2, dated Jan. 22, 2024.

* cited by examiner

DISPLAY DEVICE HAVING BANKS WITH AT LEAST TWO AREAS HAVING DIFFERENT WIDTHS

CROSS-REFERENCE TO RELATED APPLICATION(S)

This application is a national entry of International Application No. PCT/KR2019/003801, filed on Apr. 1, 2019, which claims under 35 U.S.C. § 119(a) and 365(b) priority to and benefits of Korean Patent Application No. 10-2018-0117813, filed on Oct. 2, 2018 in the Korean Intellectual Property Office, the entire contents of which are incorporated herein by reference.

BACKGROUND

1. Technical Field

Various embodiments of the disclosure relate to a display device having high resolution.

2. Description of the Related Art

Recently, a technique of manufacturing a subminiature light emitting element using a material having a reliable inorganic crystal structure has been developed, as has a technique of manufacturing a display device using the light emitting element. For example, a technique of manufacturing subminiature light emitting elements having a small size corresponding to a range from a nano-scale size to a micro-scale size, and forming a pixel of a display device using the subminiature light emitting elements has been developed.

It is to be understood that this background technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure relate to a display device having high resolution.

According to an aspect of the disclosure, a display device may include a pair of first color sub-pixels arranged in a display area in a first direction, each of the pair of first color sub-pixels including at least one first color light emitting element, and a bank enclosing the pair of first color sub-pixels. The bank may include at least two areas having different widths in an area corresponding to each of the pair of first color sub-pixels.

The pair of first color sub-pixels may include at least two areas having different widths in each emission area enclosed by the bank, and the at least two areas of the pair of first color sub-pixels may contact each other in a portion of the emission area having a maximum width.

The first direction may be a vertical direction of the display area, and the bank may have a top and bottom symmetrical shape.

The pair of first color sub-pixels may include emission areas having a triangular shape and an inverted triangular shape, respectively, and the bank may have a quadrilateral shape enclosing the emission areas of the pair of first color sub-pixels.

The pair of first color sub-pixels may be symmetrically arranged in the first direction, each of the pair of first color sub-pixels may have an emission area of an isosceles triangular shape, and the bank may have a diamond shape and may enclose the emission areas of the pair of first color sub-pixels.

Each of the pair of first color sub-pixels may include a polygonal emission area having a symmetrical structure in a second direction intersecting the first direction, and the bank may have a polygonal shape having a symmetrical structure in the first direction and the second direction.

Each of the pair of first color sub-pixels may include a step-shaped emission area.

The display device may further include a second color sub-pixel disposed adjacent to at least one first color sub-pixel of the pair of first color sub-pixels in the second direction intersecting with the first direction, and including at least one second color light emitting element, and a third color sub-pixel disposed adjacent to the second color sub-pixel in the second direction, and including at least one third color light emitting element.

The second color sub-pixel may include an emission area having a shape in which an emission area of the at least one of first color sub-pixels may be inverted in the first direction, and the third color sub-pixel may include an emission area having the same shape as the emission area of the at least one of first color sub-pixels.

The second color sub-pixel may be disposed between the at least one of first color sub-pixel and the third color sub-pixel. An emission area of the at least one of first color sub-pixels and an emission area of the third color sub-pixel may have a triangular shape, and the emission area of the second color sub-pixel may have an inverted triangular shape.

The display device may include a trapezoidal pixel including the at least one of first color sub-pixels, the second color sub-pixel, and the third color sub-pixel.

The second color sub-pixel may include an emission area having a shape in which an emission area of the at least one of first color sub-pixels may be inverted in the second direction, and the third color sub-pixel may include an emission area having a shape in which the emission area of the second color sub-pixel may be inverted in the first direction and the second direction.

Each of the pair of first color sub-pixels may further include a first electrode disposed in each emission area, and electrically connected to a first end of the first color light emitting element, and a second electrode disposed in each emission area to be spaced apart from the first electrode, and electrically connected to a second end of the first color light emitting element.

The first electrodes disposed in the pair of first color sub-pixels may have a same shape, and the second electrodes disposed in the pair of first color sub-pixels may have a same shape.

The first electrodes disposed in the pair of first color sub-pixels may be symmetrical with each other, and the second electrodes disposed in the pair of first color sub-pixels may be symmetrical with each other.

The first electrodes of the pair of first color sub-pixels may be separated from each other, and the second electrodes of the pair of first color sub-pixels may be electrically connected to each other.

Each of the pair of first color sub-pixels may further include a first partition wall disposed between a substrate and the first electrode, a second partition wall disposed between the substrate and the second electrode, a first contact electrode disposed on the first end of the first color light emitting element and a portion of the first electrode, the first contact electrode electrically connecting the first end of the first color light emitting element to the first electrode, and a second contact electrode disposed on the second end of the first color light emitting element and a portion of the second electrode, the second contact electrode electrically connecting the second end of the first color light emitting element to the second electrode.

A display device may include a pair of emission areas arranged in a display area and contacting each other, the pair of emission areas each including a first electrode, a second electrode, and at least one first color light emitting element disposed between the first electrode and the second electrode, and a bank enclosing the pair of emission areas. The bank may include at least two areas having different widths in an area corresponding to each of the pair of emission areas, and may have a maximum width in an area where the emission areas contact each other.

The pair of emission areas may vertically contact with each other in the display area, and the bank may have a top and bottom symmetrical shape.

The first electrodes of the pair of emission areas may be separated from each other.

According to various embodiments of the disclosure, it may be possible to provide a display device having high resolution.

BRIEF DESCRIPTION OF THE DRAWINGS

FIGS. 12 and 13 are sectional views taken along line I-I' of FIG. 10a in accordance with different embodiments.

DETAILED DESCRIPTION OF THE EMBODIMENTS

Figure 1A:
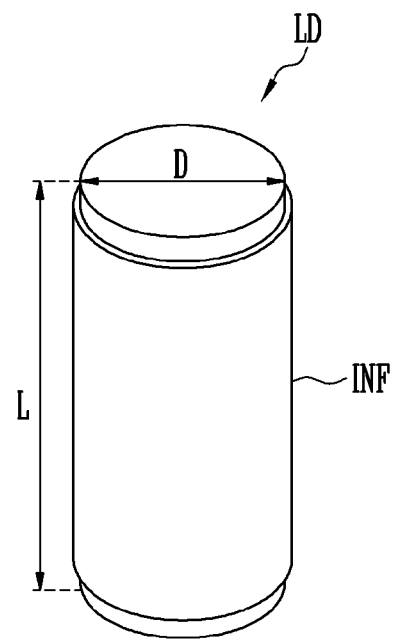
FIGS. 1a and 1b are a schematic perspective view and a schematic sectional view illustrating a light emitting element in accordance with an embodiment of the disclosure.

Reference will now be made in detail to various embodiments of the disclosure. Only specific examples are illustrated in the accompanying drawings and described below, since the embodiments of the disclosure can be variously modified. The disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to designate the same or similar elements throughout the drawings, and repetitive explanation will be omitted.

Embodiments and required details of the disclosure are described with reference to the accompanying drawings in order to describe the disclosure in detail so that those having ordinary knowledge in the technical field to which the disclosure pertains can easily practice the disclosure. Furthermore, a singular form may include a plural form unless the context clearly indicates otherwise. The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." The phrase "at least one of" is intended to include the meaning of "at least one selected from the group of" for the purpose of its meaning and interpretation.

It will be understood that, although the terms "first", "second", etc. may be used herein to describe various elements, these elements should not be limited by these terms. It will be further understood that the terms "comprise", "include", "have", etc. specify the presence of stated features, integers, steps, operations, elements, components, and/or combinations but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may intervene between them. The terms "position", "direction", etc. are relative terms, and it should be noted that they may be changed into a reverse position or direction depending on a view angle or orientation.

The term overlap may include layer, stack, face or facing, extending over, extending under, covering or partly covering or any other suitable term as would be appreciated and understood by those of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIGS. 1a, 1b, 2a, 2b, 3a, and 3b are schematic perspective views and schematic sectional views illustrating a light emitting element LD in accordance with an embodiment of the disclosure. Although a rod-type light emitting element LD of a cylindrical shape is illustrated in FIGS. 1a to 3b, the type and/or shape of the light emitting element LD according to the disclosure are not limited thereto.

Figure 1B:
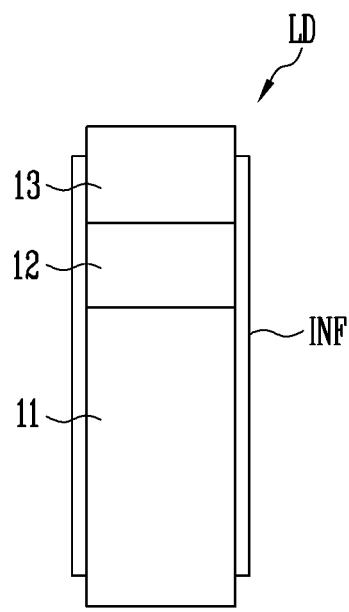

First, referring to FIGS. 1a and 1b, the light emitting element LD in accordance with the embodiment of the disclosure may include a first conductivity type semiconductor layer 11, a second conductivity type semiconductor layer 13, and an active layer 12 interposed between the first and second conductivity type semiconductor layers 11 and 13. For example, the light emitting element LD may be configured of a stacked body formed by successively stacking the first conductivity type semiconductor layer 11, the active layer 12, and the second conductivity type semiconductor layer 13 in a longitudinal direction L.

In an embodiment, the light emitting element LD may be provided in the form of a rod extending in one direction. If the direction in which the light emitting element LD extends is defined as the longitudinal direction L, the light emitting element LD may have a first end and a second end with respect to the longitudinal direction L.

In an embodiment, one of the first and second conductivity type semiconductor layers 11 and 13 may be disposed on the first end of the light emitting element LD, and the other of the first and second conductivity type semiconductor layers 11 and 13 may be disposed on the second end of the light emitting element LD.

In an embodiment, the light emitting element LD may be a rod-type light emitting diode manufactured in the form of a rod. In this specification, the term "rod-type" embraces a rod-like shape and a bar-like shape such as a cylindrical shape and a prismatic shape extending in the longitudinal direction L (i.e., to have an aspect ratio greater than 1), and the cross-sectional shape thereof is not limited to a particular shape. For example, a length L of the light emitting element LD may be greater than a diameter D thereof (or a width of the cross-section thereof).

In an embodiment, the light emitting element LD may have a small size corresponding to a nano-scale or a micro-scale, e.g., a diameter D and/or a length L corresponding to a nano scale or micro scale range. However, in the disclosure, the size of the light emitting element LD is not limited thereto. For example, the size of the light emitting element LD may be changed in various ways depending on design conditions of various devices, e.g., a display device, which employs, as a light source, a light emitting device using the light emitting element LD.

The first conductivity type semiconductor layer 11 may include, for example, at least one n-type semiconductor layer. For instance, the first conductivity type semiconductor layer 11 may include an n-type semiconductor layer which includes any one or more semiconductor material of InAlGaN, GaN, AlGaN, InGaN, AlN, and InN, and may be doped with a first conductive dopant such as Si, Ge, or Sn. However, the material forming the first conductivity type semiconductor layer 11 is not limited thereto, and the first conductivity type semiconductor layer 11 may be formed of various other materials.

The active layer 12 may be disposed on the first conductivity type semiconductor layer 11 and have a single or multiple quantum well structure. In an embodiment, a cladding layer (not shown) doped with a conductive dopant may be formed above and/or under the active layer 12. For example, the cladding layer may be formed of an AlGaN layer, an InAlGaN layer, or a combination thereof. In an embodiment, a material such as AlGaN, AlInGaN, or a combination thereof may be used to form the active layer 12, and various other materials may be used to form the active layer 12.

If an electric field of a voltage or more is applied to the opposite ends of the light emitting element LD, the light emitting element LD may emit light by coupling of electron-hole pairs in the active layer 12. Since light emission of the light emitting element LD can be controlled based on the foregoing principle, the light emitting element LD may be used as a light source of various light emitting devices as well as a pixel of the display device.

The second conductivity type semiconductor layer 13 may be disposed on the active layer 12 and include a semiconductor layer of a type different from that of the first conductivity type semiconductor layer 11. For example, the second conductivity type semiconductor layer 13 may include at least one p-type semiconductor layer. For instance, the second conductivity type semiconductor layer 13 may include a p-type semiconductor layer which includes any one or more semiconductor material of InAlGaN, GaN, AlGaN, InGaN, AlN, and InN, and may be doped with a second conductive dopant such as Mg. However, the material forming the second conductivity type semiconductor layer 13 is not limited thereto, and the second conductivity type semiconductor layer 13 may be formed of various other materials.

In an embodiment, the light emitting element LD may further include an insulating film INF provided on the surface of the light emitting element. The insulating film INF may be formed on the surface of the light emitting element LD to enclose an outer circumferential surface of at least the active layer 12. The insulating film may further enclose an area of each of the first and second conductivity type semiconductor layers 11 and 13. The insulating film INF may allow the opposite ends of the light emitting element LD that have different polarities to be exposed to the outside. For example, the insulating film INF may expose one end of each of the first and second conductivity type semiconductor layers 11 and 13 that may be disposed on the respective opposite ends of the light emitting element LD with respect to the longitudinal direction (L), e.g., may expose each of the top and bottom surfaces of the cylinder rather than covering it.

In an embodiment, the insulating film INF may include at least one insulating material of $SiO_2$, $Si_3N_4$, $Al_2O_3$, and $TiO_2$, but it is not limited thereto. In other words, the material forming the insulating film INF is not limited to a particular material, and the insulating film INF may be formed of well-known various insulating materials.

In an embodiment, the light emitting element LD may further include additional other components as well as the first conductivity type semiconductor layer 11, the active layer 12, the second conductivity type semiconductor layer 13, and/or the insulating film INF. For example, the light emitting element LD may further include at least one fluorescent layer, at least one active layer, at least one semiconductor layer and/or at least one electrode layer disposed on an end of the first conductivity type semiconductor layer 11, the active layer 12, and/or the second conductivity type semiconductor layer 13.

Figure 2A:
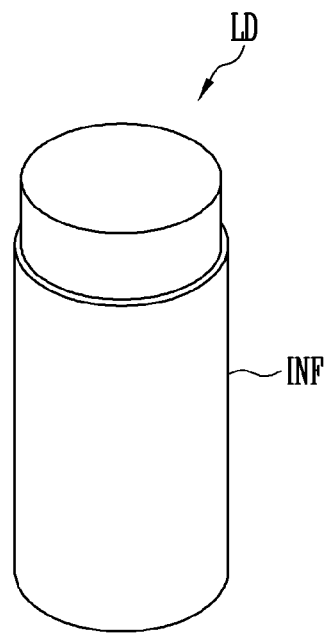
FIGS. 2a and 2b are a schematic perspective view and a schematic sectional view illustrating a light emitting element in accordance with an embodiment of the disclosure.
Figure 2B:
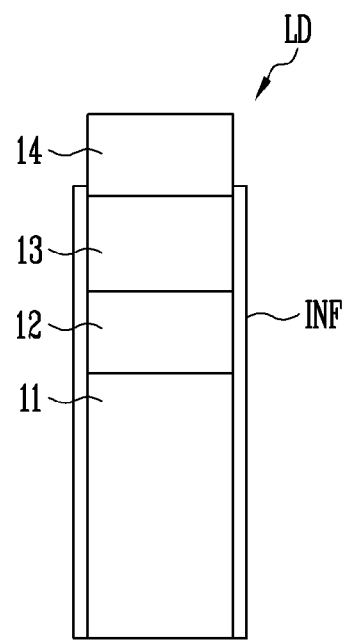
Figure 3A:
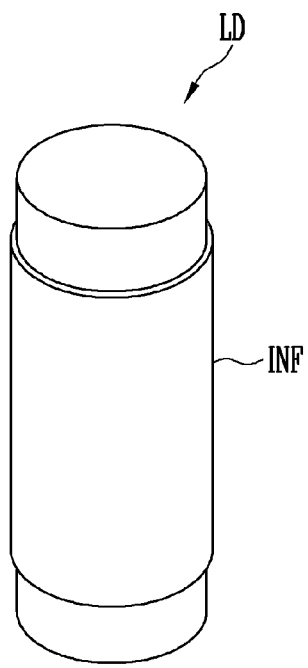
FIGS. 3a and 3b are a schematic perspective view and a sectional view illustrating a light emitting element in accordance with an embodiment of the disclosure.
Figure 3B:
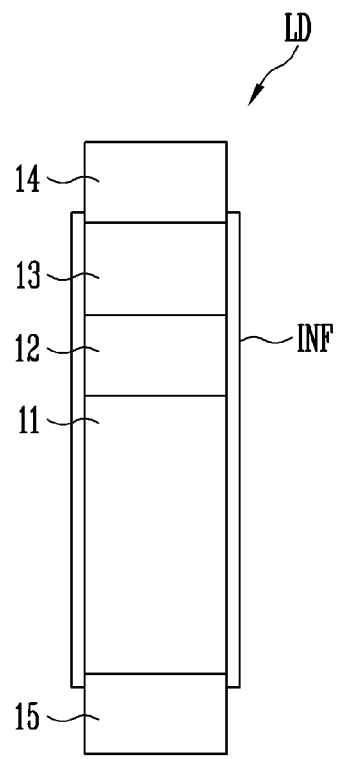

For example, as shown in FIGS. 2a and 2b, the light emitting element LD may further include at least one electrode layer 14 disposed on an end of the second conductivity type semiconductor layer 13. In an embodiment, as shown in FIGS. 3a and 3b, the light emitting element LD may further include at least one electrode layer 15 disposed on the first end of the first conductivity type semiconductor layer 11.

Each of the electrode layers 14 and 15 may be an ohmic contact electrode, but it is not limited thereto. Furthermore, each of the electrode layers 14 and 15 may include metal or a metal oxide. For example, Cr, Ti, Al, Au, Ni, ITO, IZO, ITZO, and an oxide or alloy thereof may be used alone or in combination with each other. In an embodiment, the electrode layers 14 and 15 may be substantially transparent or translucent. Thereby, light generated from the light emitting element LD may be emitted to the outside of the light emitting element LD after passing through the electrode layers 14 and 15.

In an embodiment, the insulating film INF may at least partially enclose the outer surfaces of the electrode layers 14 and 15, or may not enclose them. In other words, the insulating film INF may be selectively formed on the surfaces of the electrode layers 14 and 15. Furthermore, the insulating layer INF may be formed to expose the opposite ends of the light emitting element LD that may have different polarities, for example, may expose at least an area of each of the electrode layers 14 and 15. In another embodiment, the insulating film INF may not be provided.

If the insulating film INF is provided on the surface of the light emitting element LD, particularly, on the surface of the active layer 12, the active layer 12 may be prevented from short-circuiting with at least one electrode (not shown), e.g., at least one contact electrode of contact electrodes coupled to the opposite ends of the light emitting element LD, etc. Consequently, the electrical stability of the light emitting element LD may be secured.

Furthermore, thanks to the insulating film INF that may be formed on the surface of the light emitting element LD, occurrence of a defect on the surface of the light emitting element LD may be minimized, whereby the lifetime and efficiency of the light emitting element may be improved. If the insulating film INF is formed on each light emitting element LD, even in case that multiple light emitting elements LD are disposed adjacent to each other, the light emitting elements LD may be prevented from undesirably short-circuiting.

In an embodiment of the disclosure, a surface treatment process may be performed to fabricate the light emitting element LD. For example, the light emitting element LD may be surface-treated (e.g., through a coating process) so that, in case that multiple light emitting elements LD are mixed with a fluidic solution and supplied to each emission area (e.g., emission area of each pixel), the light emitting elements LD can be evenly distributed rather than unevenly aggregating in solution.

A light emitting device including the light emitting element LD described above may be used in various devices including a display device which may require a light source. For instance, at least one subminiature light emitting element LD, e.g., multiple subminiature light emitting elements LD may be disposed in each sub-pixel area of a display panel so as to form a light source (or a light source unit) of each sub-pixel. Furthermore, the field of application of the light emitting element LD according to the disclosure is not limited to the display device. For example, the light emitting element LD may also be used in various devices such as a lighting device, which requires a light source.

Figure 4:
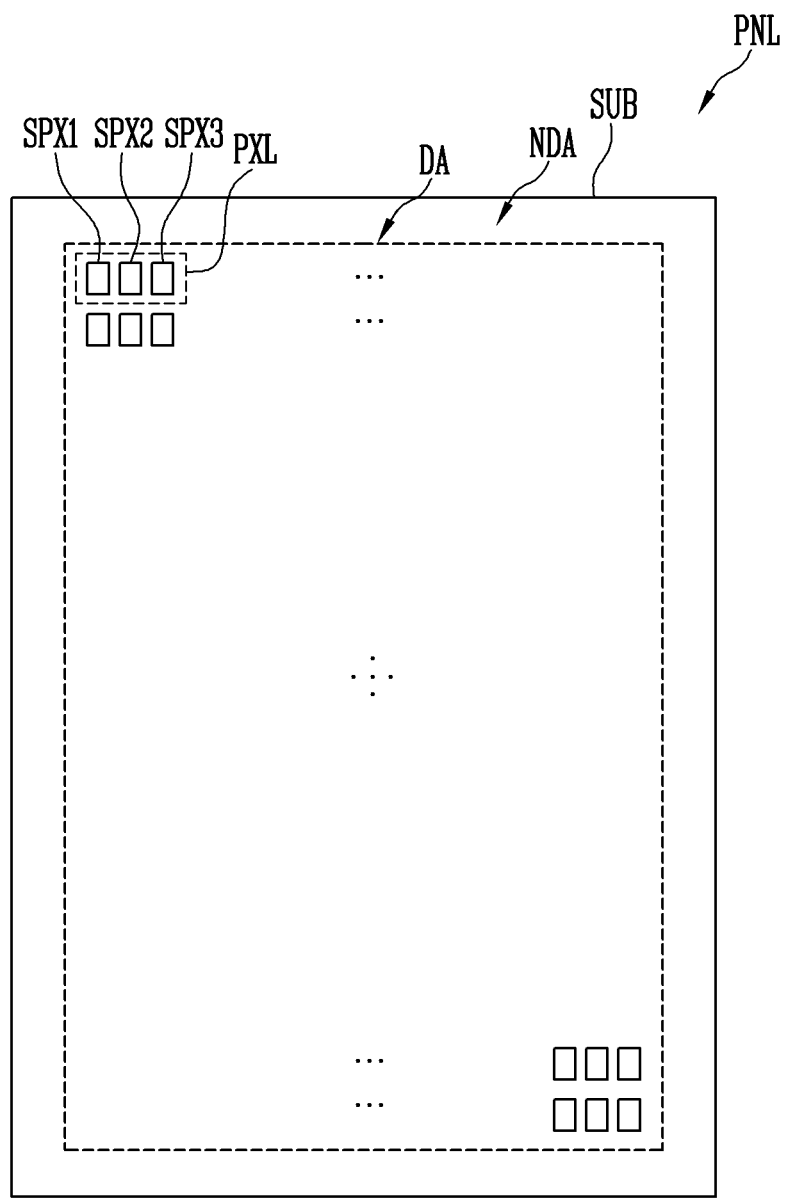
FIG. 4 is a schematic plan view illustrating a display device in accordance with an embodiment of the disclosure.

FIG. 4 is a schematic plan view illustrating a display device in accordance with an embodiment of the disclosure. In an embodiment, FIG. 4 illustrates a display device, particularly, a display panel PNL provided in the display device, as an example of a device which may use, as a light source, the light emitting elements LD described with reference to FIGS. 1a to 3b. For the sake of explanation, FIG. 4 simply illustrates the structure of the display panel PNL in accordance with an embodiment, focused on a display area DA. In some embodiments, although not illustrated, at least one driving circuit component (e.g., at least one of a scan driver and a data driver) and/or multiple lines may be further provided on the display panel PNL.

Referring to FIG. 4, the display panel PNL in accordance with an embodiment of the disclosure may include a substrate SUB, and pixels PXL disposed on the substrate SUB. In detail, the display panel PNL and the substrate SUB for forming the display panel may include a display area DA having pixels PXL, and a non-display area NDA formed in an area other than the display area DA.

In an embodiment, the display area DA may be disposed in a central portion of the display panel PNL, and the non-display area NDA may be disposed in a perimeter portion of the display panel PNL in such a way as to enclose the display area DA. The locations of the display area DA and the non-display area NDA are not limited thereto, and the locations thereof may be changed.

The substrate SUB may form a base member of the display panel PNL. In an embodiment, the substrate SUB may be a rigid or flexible substrate, and the material or properties thereof are not particularly limited. For example, the substrate SUB may be a rigid substrate made of glass or reinforced glass, or a flexible substrate formed of a thin film made of plastic, metal, or a combination thereof. Furthermore, the substrate SUB may be a transparent substrate, but it is not limited thereto. For instance, the substrate SUB may be a translucent substrate, an opaque substrate, or a reflective substrate.

An area on the substrate SUB may be defined as the display area DA in which the pixels PXL may be disposed, and the other area thereof may be defined as the non-display area NDA. For example, the substrate SUB may include the display area DA including multiple pixel areas on which the respective pixels PXL may be formed, and the non-display area NDA disposed around the display area DA. Various lines and/or internal circuit units which may be coupled to the pixels PXL of the display area DA may be disposed in the non-display area NDA.

Each of the pixels PXL may include at least one light emitting element LD (e.g., at least one rod-type light emitting diode of any of the embodiments of FIGS. 1a to 3b) which may be driven by a corresponding scan signal and a data signal. For example, each of the pixels PXL may include rod-type light emitting diodes, which each may have a small size ranging from a nano-scale to a micro-scale and may be coupled parallel to each other in each sub-pixel area. The rod-type light emitting diodes may form a light source of each pixel PXL or sub-pixel.

Furthermore, each of the pixels PXL may include sub-pixels. For example, each pixel PXL may include a first sub-pixel SPX1, a second sub-pixel SPX2, and a third sub-pixel SPX3, which may emit light of different colors. For instance, the first sub-pixel SPX1 may be a red sub-pixel for emitting red light, the second sub-pixel SPX2 may be a green sub-pixel for emitting green light, and the third sub-pixel SPX3 may be a blue sub-pixel for emitting blue light. However, the colors, types and/or number of sub-pixels forming each pixel PXL are not particularly limited. For example, the color of light which is emitted from each sub-pixel may be changed in various ways. Although in FIG. 4 there is illustrated an embodiment where the pixels PXL (or sub-pixels) are arranged in the display area DA in a stripe shape, the disclosure is not limited thereto. For instance, the display area DA may have various well-known pixel arrangement structures.

In an embodiment, each pixel PXL (or each sub-pixel) may be formed of an active pixel. However, the types, structures, and/or driving methods of the pixels PXL capable of being applied to the display device according to the disclosure are not particularly limited. For example, each pixel PXL may have the same structure as that of a pixel of various well-known passive or active light emitting display devices.

Figure 5A:
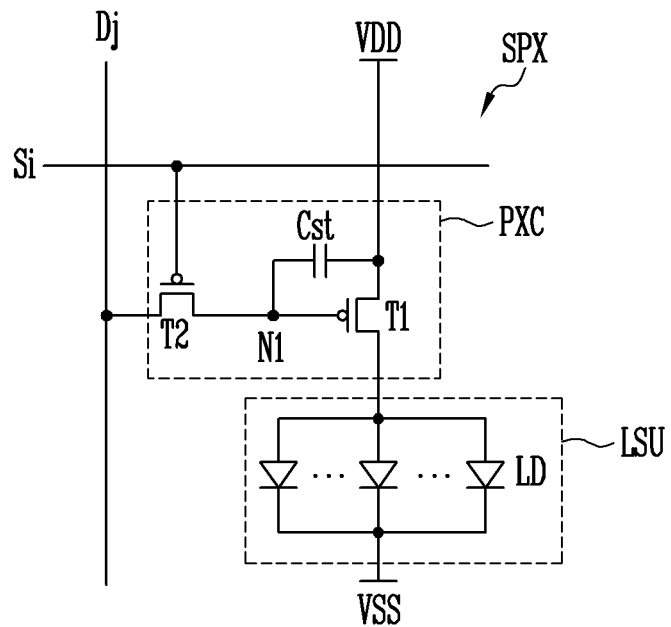
FIGS. 5a to 5c are schematic circuit diagrams each illustrating a sub-pixel in accordance with an embodiment of the disclosure.
Figure 5B:
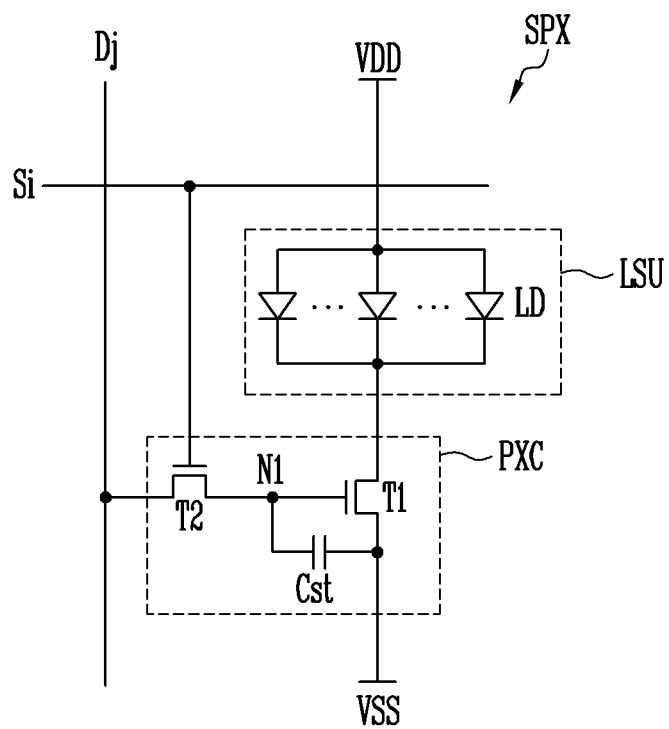
Figure 5C:
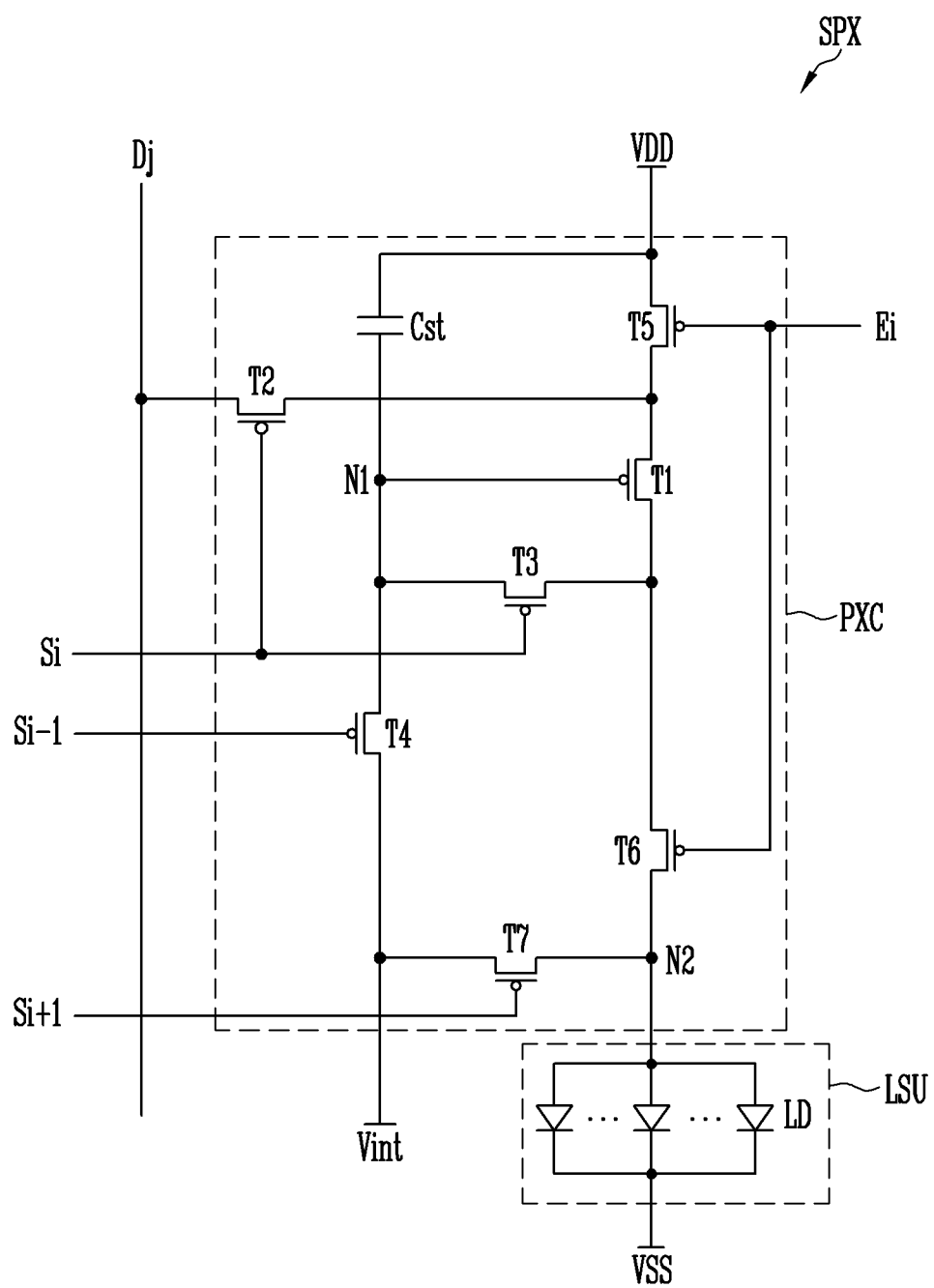

FIGS. 5a to 5c are schematic circuit diagrams each illustrating a sub-pixel SPX in accordance with an embodiment of the disclosure, for example, to illustrate any of the first, second, and third sub-pixels SPX1, SPX2, and SPX3 shown in FIG. 4.

To be more specific, FIGS. 5a to 5c illustrate different embodiments of the sub-pixel SPX that may be provided in the active display device (e.g., active light emitting display device). For example, each sub-pixel SPX shown in FIGS. 5a to 5c may be any of the first, second, and third sub-pixels SPX1, SPX2, and SPX3 provided in the display panel PNL of FIG. 4. The structures of the first, second, and third sub-pixels SPX1, SPX2, and SPX3 may be substantially identical or similar to each other. Hereinafter, when referring to any one or all of the first, second, and third sub-pixels SPX1, SPX2, and SPX3, they may be referred to as the "sub-pixel SPX".

Referring to FIG. 5a, the sub-pixel SPX in accordance with an embodiment of the disclosure may include a light source unit LSU generating light having a luminance corresponding to a data signal, and a pixel circuit PXC driving the light source unit LSU.

In an embodiment, the light source unit LSU may include light emitting elements LD coupled parallel to each other between first and second power supplies VDD and VSS. Here, the first and second power supplies VDD and VSS may have different potentials to make it possible for the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during a light emitting period of at least each sub-pixel SPX.

Although in FIG. 5a there is illustrated an embodiment in which the light emitting elements LD forming the light source unit LSU of each sub-pixel SPX are coupled parallel to each other in the same direction (e.g., in a forward direction) between the first power supply VDD and the second power supply VSS, the disclosure is not limited thereto. For example, in another embodiment, some of the light emitting elements LD may be coupled to each other in the forward direction between the first and second power supplies VDD and VSS, and the other light emitting elements LD may be coupled to each other in the reverse direction. In another embodiment, at least one sub-pixel SPX may include a single light emitting element LD.

In an embodiment, first ends of the light emitting elements LD forming each light source unit LSU may be connected n common to a corresponding pixel circuit PXC through a first electrode of the corresponding light source unit LSU and may be connected to the first power supply VDD through the pixel circuit PXC. Furthermore, second ends of the light emitting elements LD may be connected in common to the second power supply VSS through a second electrode of the light source unit LSU.

Each light source unit LSU may emit light having a luminance corresponding to driving current supplied thereto through the corresponding pixel circuit PXC. Thereby, an image may be displayed in the display area DA.

The pixel circuit PXC may be connected to a scan line Si and a data line Dj of the corresponding sub-pixel SPX. For example, if the sub-pixel SPX is disposed on an i-th row (i may be a natural number) and a j-th column (j may be a natural number) of the display area DA, the pixel circuit PXC of the sub-pixel SPX may be connected to an i-th scan line Si and a j-th data line Dj of the display area DA. The pixel circuit PXC may include a first transistor T1, a second transistor T2, and a storage capacitor Cst.

The first transistor (driving transistor) T1 may be connected between the first power supply VDD and the first electrode of the light source unit LSU. A gate electrode of the first transistor T1 may be connected to a first node N1. The first transistor T1 may control driving current supplied to the light source unit LSU in response to a voltage of the first node N1.

The second transistor (switching transistor) T2 may be connected between the data line Dj and the first node N1. A gate electrode of the second transistor T2 may be connected to the scan line Si.

When a scan signal of a gate-on voltage (e.g., a low voltage) is supplied from the scan line Si, the second transistor T2 may be turned on to electrically couple the first node N1 to the data line Dj. During each frame period, a data signal of a corresponding frame may be supplied to the data line Dj. The data signal may be transmitted to the first node N1 via the second transistor T2. Thereby, a voltage corresponding to the data signal may be charged to the storage capacitor Cst.

A first electrode of the storage capacitor Cst may be connected to the first power supply VDD, and a second electrode thereof may be connected to the first node N1. The storage capacitor Cst may charge voltage corresponding to a data signal supplied to the first node N1 during each frame period, and maintain the charged voltage until a data signal of a subsequent frame may be supplied.

Although in FIG. 5a the transistors, e.g., the first and second transistors T1 and T2, included in the pixel circuit PXC have been illustrated as being formed of P-type transistors, the disclosure is not limited thereto. In other words, any of the first and second transistors T1 and T2 may be changed to an N-type transistor.

For example, as shown in FIG. 5b, both the first and second transistors T1 and T2 may be formed of N-type transistors. The configuration and operation of the sub-pixel SPX shown in FIG. 5b may be substantially similar to those of the pixel circuit PXC of FIG. 5a, except that connection positions of some circuit elements have been changed depending on a change in type of the transistors. Therefore, detailed description of the sub-pixel SPX of FIG. 5b will be omitted.

The structure of the pixel circuit PXC is not limited to the embodiments shown in FIGS. 5a and 5b. In other words, the pixel circuit PXC may be formed of a well-known pixel circuit which may have various structures and/or be operated by various driving schemes. For example, the pixel circuit PXC may be configured in the same manner as that of an embodiment illustrated in FIG. 5c.

Referring to FIG. 5c, the pixel circuit PXC may be connected not only to a scan line Si of a corresponding horizontal line but also to at least one another scan line (or a control line). For example, the pixel circuit PXC of the sub-pixel SPX disposed on the i-th row of the display area DA may be further connected to an i−1-th scan line Si−1 and/or an i+1-th scan line Si+1. In an embodiment, the pixel circuit PXC may be coupled not only to the first and second power supplies VDD and VSS but also to other power supplies. For instance, the pixel circuit PXC may also be coupled to an initialization power supply Vint. In an embodiment, the pixel circuit PXC may include first to seventh transistors T1 to T7 and a storage capacitor Cst.

The first transistor T1 may be connected between the first power supply VDD and the first electrode of the light source unit LSU. A gate electrode of the first transistor T1 may be connected to a first node N1. The first transistor T1 may control driving current supplied to the light source unit LSU in response to a voltage of the first node N1.

The second transistor T2 may be connected between the data line Dj and the first electrode of the first transistor T1. A gate electrode of the second transistor T2 may be connected to the corresponding scan line Si. In case that a scan signal of a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 may be connected between the second electrode of the first transistor T1 and the first node N1. A gate electrode of the third transistor T3 may be connected to the corresponding scan line Si. In case that a scan signal of a gate-on voltage is supplied from the scan line Si, the third transistor T3 may be turned on to connect the first transistor T1 in the form of a diode.

The fourth transistor T4 may be connected between the first node N1 and the initialization power supply Vint. A gate electrode of the fourth transistor T4 may be connected to a preceding scan line, e.g., an i–1-th scan line Si–1. In case that a scan signal of a gate-on voltage is supplied to the i–1-th scan line Si–1, the fourth transistor T4 may be turned on so that the voltage of the initialization power supply Vint may be transmitted to the first node N1. Here, the voltage of the initialization power supply Vint may be a minimum voltage of a data signal or less.

The fifth transistor T5 may be connected between the first power supply VDD and the first transistor T1. A gate electrode of the fifth transistor T5 may be coupled to a corresponding emission control line, e.g., an i-th emission control line Ei. The fifth transistor T5 may be turned off in case that an emission control signal of a gate-off voltage (e.g., a high voltage) is supplied to the emission control line Ei, and may be turned on in other cases.

The sixth transistor T6 may be connected between the first transistor T1 and the first electrode of the light source unit LSU. A second node N2 may be between the sixth transistor T6 and the light source unit LSU. A gate electrode of the sixth transistor T6 may be connected to a corresponding emission control line, e.g., the i-th emission control line Ei. The sixth transistor T6 may be turned off in case that an emission control signal of a gate-off voltage is supplied to the emission control line Ei, and may be turned on in other cases.

The seventh transistor T7 may be connected between the first electrode of the light source unit LSU and the initialization power supply Vint. A gate electrode of the seventh transistor T7 may be connected to any scan line of a subsequent stage, e.g., to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the first electrode of the light source unit LSU.

The storage capacitor Cst may be connected between the first power supply VDD and the first node N1. The storage capacitor Cst may store a voltage corresponding both to the data signal supplied to the first node N1 during each frame period and to the threshold voltage of the first transistor T1.

Although in FIG. 5c the transistors, e.g., the first to seventh transistors T1 to T7, included in the pixel circuit PXC have been illustrated as being formed of P-type transistors, the disclosure is not limited thereto. For example, at least one of the first to seventh transistors T1 to T7 may be changed to an N-type transistor.

Furthermore, the structure of the sub-pixel SPX which may be applied to the disclosure is not limited to the embodiments shown in FIGS. 5a to 5c, and each sub-pixel SPX may have various well-known structures. For example, the pixel circuit PXC included in each sub-pixel SPX may be formed of a well-known pixel circuit which may have various structures and/or be operated by various driving methods. In another embodiment of the disclosure, each sub-pixel SPX may be configured in a passive light emitting display device or the like. The pixel circuit PXC may be omitted, and each of the first and second pixel electrodes of the light source unit LSU may be connected (e.g., directly connected) to the scan line Si, the data line Dj, a power line, and/or the control line.

Figure 6:
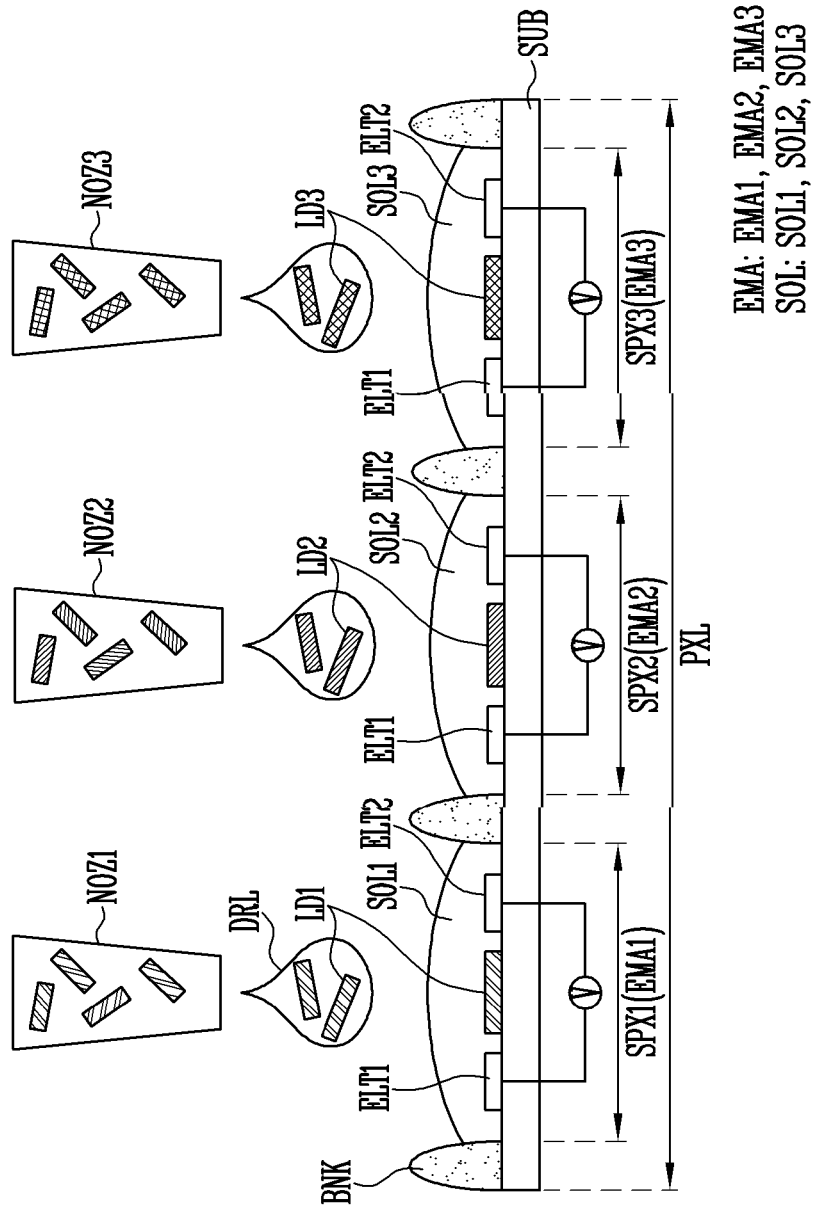
FIG. 6 is a schematic sectional view illustrating a method of supplying and aligning a light emitting element in accordance with an embodiment of the disclosure.

FIG. 6 is a schematic sectional view illustrating a method of supplying and aligning a light emitting element LD in accordance with an embodiment of the disclosure.

Referring to FIG. 6, the sub-pixels SPX in accordance with an embodiment of the disclosure include respective emission areas partitioned by banks BNK. For example, the first sub-pixel SPX1 may include a first emission area EMA1, the second sub-pixel SPX2 may include a second emission area EMA2, and the third sub-pixel SPX3 may include a third emission area EMA3. Hereinafter, when referring to any one or all of the first, second, and third emission areas EMA1, EMA2, and EMA3, they may be referred to as the "emission area EMA".

In an embodiment, a bank BNK may be disposed between the emission areas EMA to enclose each emission area EMA. At least one pair of first and second electrodes ELT1 and ELT2 may be disposed in each emission area EMA to be spaced apart from each other.

In an embodiment of the disclosure, the light emitting elements LD may be supplied to each emission area EMA through an inkjet printing method. For example, at least one light emitting element LD1 of a first color may be supplied to the first emission area EMA1, by disposing, on the first emission area EMA1, a first nozzle NOZ1 containing a first LED solution SOL1 in which multiple light emitting elements LD1 of the first color (e.g., red light emitting elements) may be dispersed, and dropping a droplet DRL of the first LED solution SOL1 on the first emission area EMA1.

Likewise, at least one light emitting element LD2 of a second color may be supplied to the second emission area EMA2, by disposing, on the second emission area EMA2, a second nozzle NOZ2 containing a second LED solution SOL2 in which multiple light emitting elements LD2 of the second color (e.g., green light emitting elements) may be dispersed, and dropping a droplet DRL of the second LED solution SOL2 on the second emission area EMA2. Furthermore, at least one light emitting element LD3 of a third color may be supplied to the third emission area EMA3, by disposing, on the third emission area EMA3, a third nozzle NOZ3 containing a third LED solution SOL3 in which multiple light emitting elements LD3 of the third color (e.g., blue light emitting elements) may be dispersed, and dropping a droplet DRL of the third LED solution SOL3 on the third emission area EMA3.

Hereinafter, when referring to any one or all of the first, second, and third light emitting elements LD1, LD2, and LD3, they may be referred to as the "light emitting element LD". Furthermore, when referring to any one or all of the first, second, and third LED solutions SOL1, SOL2, and SOL3, they may be referred to as the "LED solution SOL".

In an embodiment, each LED solution SOL may be in the form of ink or paste, but the disclosure is not limited thereto. As a solvent, a photo-resist containing a solvent or an organic layer may be used. However, the disclosure is not limited thereto. Furthermore, in an embodiment, the solvent may be a volatile solvent, but the disclosure is not limited thereto.

After at least one light emitting element LD is supplied to each emission area EMA or simultaneously with the supply of the light emitting element LD, a voltage (e.g., a certain AC voltage) may be applied between the first electrode ELT1 and the second electrode ELT2 of each emission area EMA to form an electric field. As the dielectrophoresis of the light emitting elements LD is generated, the light emitting elements LD may be self-aligned between the first electrode ELT1 and the second electrode ELT2 of each emission area EMA.

Subsequently, if the solvent of the LED solution SOL dropped to each emission area EMA is removed, the light emitting elements LD may be stably disposed in the emission area EMA of each sub-pixel SPX. In an embodiment, the solvent of the LED solution SOL may be formed of a volatile material, so that the solvent may be easily removed. However, the constituent material and/or removing method of the solvent are not limited thereto.

Figure 7:
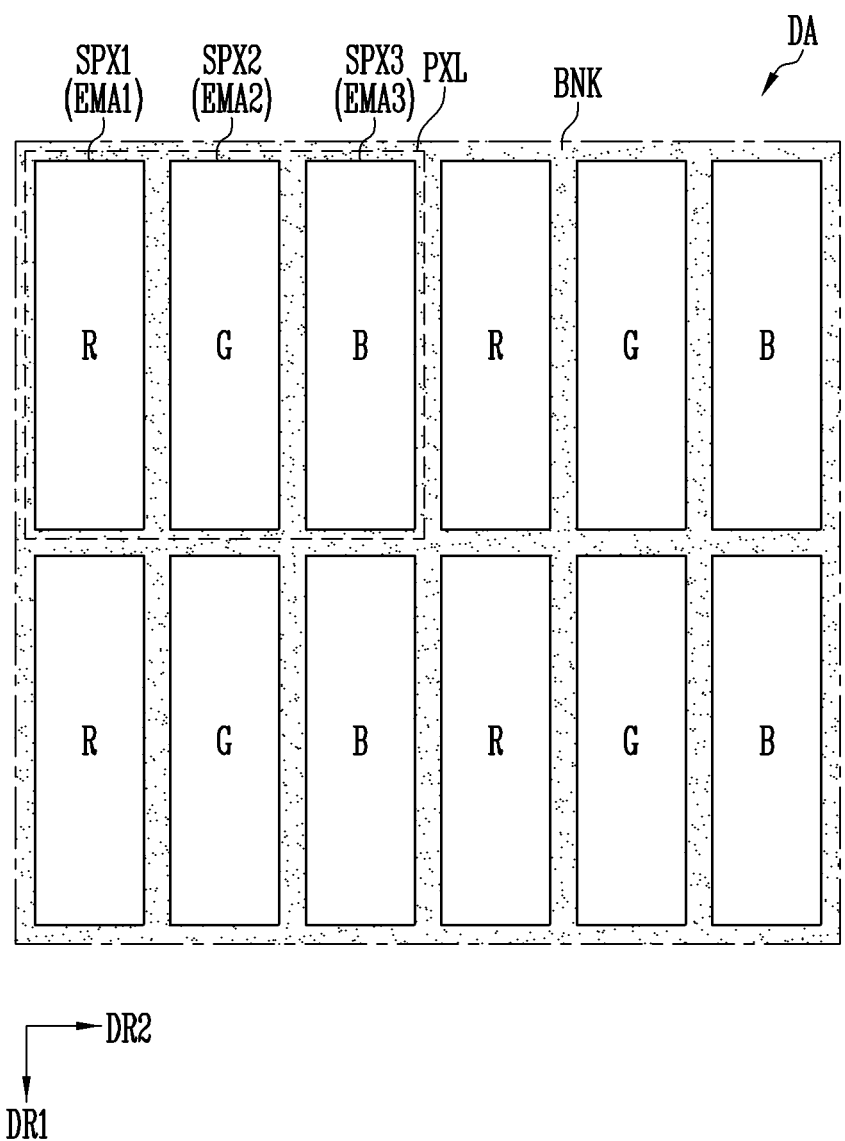
FIGS. 7 and 8 are schematic plan views each illustrating a display area in accordance with an embodiment of the disclosure.
Figure 8:
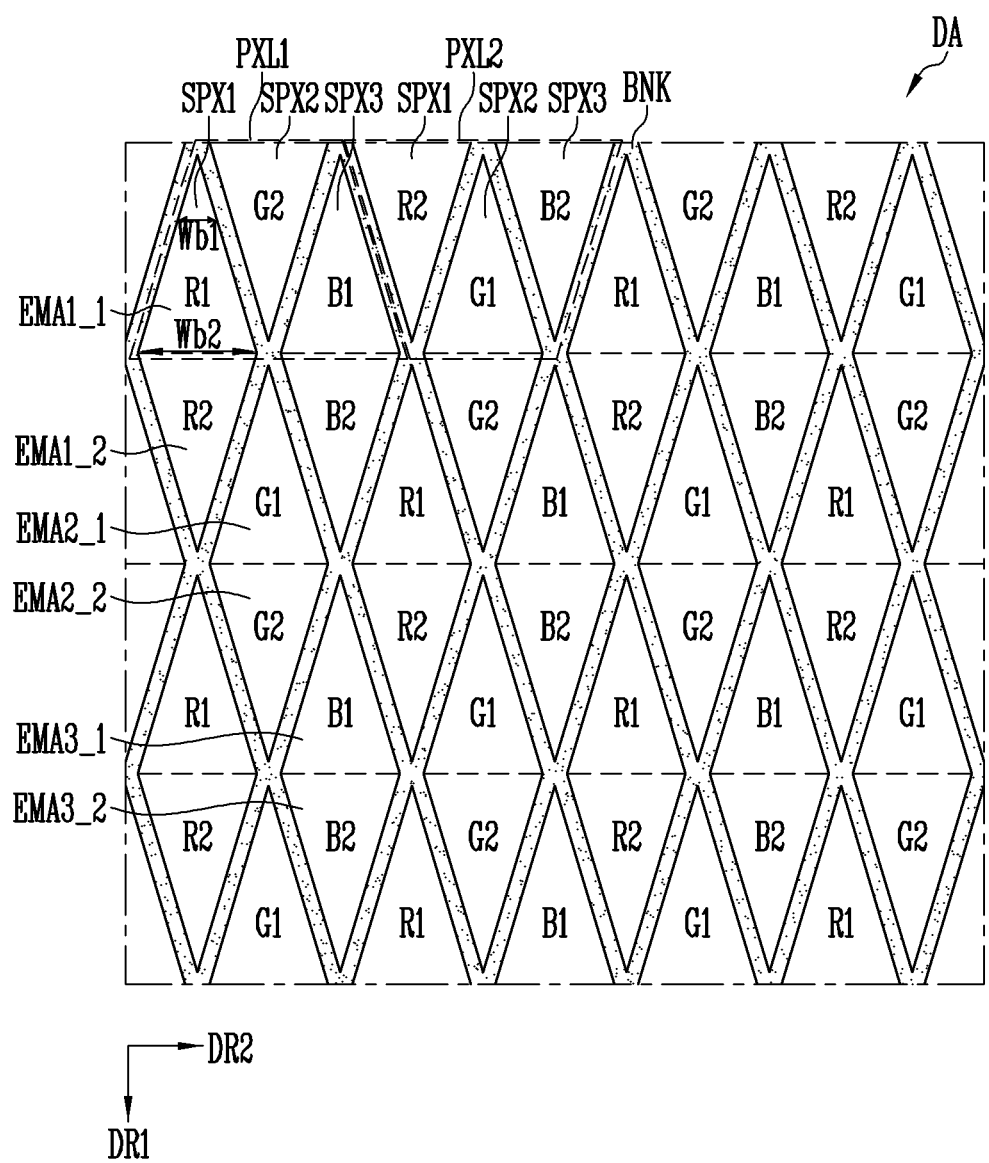

FIGS. 7 and 8 are plan views each illustrating a display area DA in accordance with an embodiment of the disclosure. For example, FIGS. 7 and 8 illustrate different embodiments of a pixel arrangement structure applicable to the display area DA of FIG. 4. In an embodiment, FIGS. 7 and 8 illustrate the sub-pixels SPX on the basis of each emission area EMA.

First, referring to FIGS. 4 to 6 and FIG. 7, each pixel PXL may include multiple sub-pixels SPX that may emit light of different colors, for instance, a first color sub-pixel SPX1 that emits light of a first color, a second color sub-pixel SPX2 that emits light of a second color, and a third color sub-pixel SPX3 that emits light of a third color. In an embodiment, the first color sub-pixel SPX1, the second color sub-pixel SPX2, and the third color sub-pixel SPX3 may be a red sub-pixel R, a green sub-pixel G, and a blue sub-pixel B, respectively, but the disclosure is not limited thereto.

In an embodiment, the pixels PXL may be arranged in a stripe shape in the display area DA. For example, the sub-pixels SPX of the same color, i.e., any type of sub-pixels SPX among the first color sub-pixels SPX1, the second color sub-pixels SPX2, and the third color sub-pixels SPX3 may be arranged in a line on each pixel column in the first direction DR1 (e.g., column direction). Furthermore, multiple sub-pixels SPX may be repeatedly arranged, in the order of the first color sub-pixel SPX1, the second color sub-pixel SPX2, and the third color sub-pixel SPX3, on each pixel row in the second direction DR2 (e.g., row direction) intersecting the first direction DR1. Here, the first color sub-pixel SPX1, the second color sub-pixel SPX2, and the third color sub-pixel SPX3, which may be continuously arranged in each pixel row, form a triad to constitute each pixel PXL.

In an embodiment, each of the pixels PXL may have a quadrangular shape. For instance, each sub-pixel SPX (especially, the emission area EMA of each sub-pixel SPX) may have a rectangular shape, and each pixel PXL (especially, the emission area EMA of each pixel PXL) may have a quadrangular shape including the sub-pixels SPX constituting the pixel. In an embodiment, the sub-pixels SPX may have substantially the same shape and/or size. Likewise, the pixels PXL may have substantially the same shape and/or size.

Each sub-pixel SPX may be enclosed by the bank BNK. For example, the bank BNK may be disposed between the sub-pixels SPX to enclose the sub-pixels SPX, particularly the emission area EMA of each of the sub-pixels SPX.

In an embodiment, the bank BNK may define a sub-pixel area in which each sub-pixel SPX may be formed, particularly, the emission area EMA of each sub pixel SPX. For example, the bank BNK may be a pixel defining layer. Furthermore, the bank BNK may also function as a dam structure in an inkjet printing process for supplying at least one light emitting element LD to each sub-pixel SPX.

In an embodiment, the bank BNK may include a light shielding material so as to block light leakage between adjacent sub-pixels SPX. For instance, the bank BNK may include a black matrix material such as carbon black. In the disclosure, the constituent material of the bank BNK is not particularly limited, and may be variously changed.

Referring to FIGS. 4 to 8, the shape and/or size of each pixel PXL and/or sub-pixel SPX (particularly, the emission area EMA of each pixel PXL and/or sub-pixel SPX) may be changed. In an embodiment, each sub-pixel SPX may include at least two areas having different widths in each emission area EMA enclosed by the bank BNK. For example, each sub-pixel SPX may have the emission area EMA of a shape that may be gradually changed in width of the second direction DR2 along the first direction DR1, for instance, a triangular shape or an inverted triangular shape.

Furthermore, in an embodiment of the disclosure, multiple sub-pixels SPX that emit light of the same color, for instance, two sub-pixels SPX of the same color that may be continuously arranged in the display area DA in the first direction DR1 form one pair to be symmetrically arranged. In an embodiment, the pair of sub-pixels SPX may be disposed to be in contact with each other, in an area having the maximum width. For example, the pair of sub-pixels SPX may be disposed to be in contact with each other in an area where a width of each emission area EMA enclosed by the bank BNK may be maximum, for instance, in an area where a horizontal width of each emission area along the second direction DR2 may be maximum, and the emission areas EMA of the pair of sub-pixels SPX may be enclosed by the bank BNK.

For example, it may be assumed that the first color sub-pixels SPX1, the second color sub-pixels SPX2, and the third color sub-pixels SPX3 may be disposed on a 3k–2-th (k may be a natural number) pixel column (vertical pixel column), a 3k–1-th pixel column, and a 3k-th pixel column, respectively. In each 3k–2-th pixel column, two first color sub-pixels SPX1 that may be continuously arranged vertically in the first direction DR1, e.g., in the vertical direction of the display area DA and each include at least one first color light emitting element LD1 (e.g., at least one first color rod-type light emitting diode having the size of a nano scale to a micro scale) may form a pair. In an embodiment, one of the pair of first color sub-pixels SPX1 may have a 1_1-th emission area EMA1_1 of a triangular shape, and the other may have a 1_2-th emission area EMA1_2 of an inverted triangular shape in which the triangular shape may be inverted in the first direction DR1. The disclosure is not limited thereto, and the shape of each of the sub-pixels SPX and/or the emission areas EMA thereof may be variously changed.

In an embodiment, the pair of first color sub-pixels SPX1 may be symmetrically disposed while coming into contact with each other in an area having the maximum width in the second direction DR2. For example, the pair of first color sub-pixels SPX1 having each emission area EMA of the triangular shape and the inverted triangular shape may be disposed symmetrically in the vertical direction such that the bases of the sub-pixels come into contact with each other.

For example, the first color sub-pixel (hereinafter, "R1" pixel) having the 1_1-th emission area EMA1_1 of the triangular shape and the first color sub-pixel (hereinafter, "R2" pixel) coming into contact with the R1 pixel through each base and having the 1_2-th emission area EMA1_2 of the inverted triangular shape in which the R1 pixel (especially, the 1_1-th emission area EMA1_1 of the R1 pixel) may be inverted up and down may be alternately disposed on each pixel column in which the first color sub-pixels SPX1 may be arranged. The pair of R1 pixel and R2 pixel may be enclosed by the bank BNK. For example, the pair of 1_1-th and 1_2-th emission areas EMA1_1 and EMA1_2 may be enclosed by the bank BNK.

Likewise, in each 3k−1-th pixel column, two second color sub-pixels SPX2 that may be continuously arranged vertically in the first direction DR1 and each include at least one second color light emitting element LD2 (e.g., at least one second color rod-type light emitting diode having the size of a nano-scale to a micro-scale) may form a pair. In an embodiment, the pair of second color sub-pixels SPX2 (especially, the second emission areas EMA2 of the pair of first color sub-pixels SPX2) may have the triangular shape and the inverted triangular shape, which may be inverted in a vertical direction relative to each other. However, the disclosure is not limited thereto.

In an embodiment, the pair of second color sub-pixels SPX2 may be symmetrically disposed while coming into contact with each other in an area having the maximum width in the second direction DR2. For example, the pair of second color sub-pixels SPX2 each having the triangular shape and the inverted triangular shape may be disposed symmetrically in the vertical direction such that the bases of the sub-pixels come into contact with each other.

For example, the second color sub-pixel (hereinafter, "G1" pixel) having the 2_1-th emission area EMA2_1 of the triangular shape and the second color sub-pixel (hereinafter, "G2" pixel) coming into contact with the G1 pixel through each base and having the 2_2-th emission area EMA2_2 of the inverted triangular shape in which the 2_1-th emission area EMA2_1 of the G1 pixel may be inverted up and down may be alternately disposed on each pixel column in which the second color sub-pixels SPX2 may be arranged. The pair of G1 pixel and G2 pixel may be enclosed by the bank BNK. For example, the pair of 2_1-th and 2_2-th emission areas EMA2_1 and EMA2_2 may be enclosed by the bank BNK.

Furthermore, in each 3k-th pixel column, two third color sub-pixels SPX3 that may be continuously arranged vertically in the first direction DR1 and each include at least one third color light emitting element LD3 (e.g., at least one third color rod-type light emitting diode having the size of a nano scale to a micro scale) may form a pair. In an embodiment, the pair of third color sub-pixels SPX3 (especially, the third emission areas EMA3 of the pair of third color sub-pixels SPX3) may have the triangular shape and the inverted triangular shape, which may be inverted in a vertical direction relative to each other. However, the disclosure is not limited thereto.

In an embodiment, the pair of third color sub-pixels SPX3 may be symmetrically disposed while coming into contact with each other in an area having the maximum width in the second direction DR2. For example, the pair of third color sub-pixels SPX3 each having the triangular shape and the inverted triangular shape may be disposed symmetrically in the vertical direction such that the bases of the sub-pixels come into contact with each other.

For example, the third color sub-pixel (hereinafter, "B1" pixel) having the 3_1-th emission area EMA3_1 of the triangular shape and the third color sub-pixel (hereinafter, "B2" pixel) coming into contact with the B1 pixel through each base and having the 3_2-th emission area EMA3_2 of the inverted triangular shape in which the 3_1-th emission area EMA3_1 of the B1 pixel may be inverted up and down may be alternately disposed on each pixel column in which the third color sub-pixels SPX3 may be arranged. The pair of B1 pixel and B2 pixel may be enclosed by the bank BNK. For example, the pair of 3_1-th and 3_2-th emission areas EMA3_1 and EMA3_2 may be enclosed by the bank BNK.

Furthermore, in an embodiment, the sub-pixels SPX having the inverted shape (e.g., the triangular shape and the inverted triangular shape) may be alternately arranged in the first direction DR1 and the second direction DR2 in the display area DA. For example, the triangular R1 pixel, the inverted triangular G2 pixel, the triangular B1 pixel, the inverted triangular R2 pixel, the triangular G1 pixel, and the inverted triangular B2 pixel may be sequentially arranged in an odd-numbered row of the display area DA, and the sub-pixels SPX may be repeatedly arranged in the same manner. The inverted triangular R2 pixel, the triangular G1 pixel, the inverted triangular B2 pixel, the triangular R1 pixel, the inverted triangular G2 pixel, and the triangular B1 pixel may be sequentially arranged in an even-numbered row of the display area DA, and the sub-pixels SPX may be repeatedly arranged in the same manner. Thus, the sub-pixels SPX may be more closely disposed in the display area DA.

For example, in each row of the display area DA, the first color sub-pixel SPX1 having a shape, the second color sub-pixel SPX2 having a shape in which the first color sub-pixel SPX1 may be inverted vertically in the first direction and disposed to be adjacent to the first color sub-pixel SPX1 in the second direction, and the third color sub-pixel SPX3 having the same shape as the first color sub-pixel SPX1 and disposed to be adjacent to the second color sub-pixel SPX2 in the second direction may be sequentially arranged. Furthermore, one first color sub-pixel SPX1, second color sub-pixel SPX2, and third color sub-pixel SPX3, which may be arranged sequentially, may form each pixel PXL.

For example, the trapezoidal first pixel PXL1 including the triangular R1 pixel, the inverted triangular G2 pixel, and the triangular B1 pixel, and the inverted trapezoidal second pixel PXL2 including the inverted triangular R2 pixel, the triangular G1 pixel, and the inverted triangular B2 pixel may be alternately arranged in each row of the display area DA. Hereinafter, when referring to any or all of the first and second pixels PXL1 and PXL2, they may be referred to as a "pixel PXL".

In an embodiment, the bank BNK may be formed to completely enclose a pair of sub-pixels SPX (especially, the emission areas EMA of the pair of sub-pixels SPX). For instance, the bank BNK may enclose the 1_1-th and 1_2-th emission areas EMA1_1 and EMA1_2 of the pair of first color sub-pixels SPX1. Likewise, the bank BNK may be formed to enclose the 2_1-th and 2_2-th emission areas EMA2_1 and EMA2_2 of the pair of second color sub-pixels SPX2, and be formed to enclose the 3_1-th and 3_2-th emission areas EMA3_1 and EMA3_2 of the pair of third color sub-pixels SPX3.

Furthermore, the bank BNK may include at least two areas of different widths, in an area corresponding to each of the pair of sub-pixels SPX, e.g., an area corresponding to each of the emission areas EMA of the sub-pixels SPX. For instance, the bank BNK may have a first bank width Wb1 in a portion of the area corresponding to each sub-pixel SPX, and have a second bank width Wb2 different from the first bank width Wb in another portion of the area.

For example, in case that the pair of sub-pixels SPX may be continuously arranged in each pixel column so that their bases come into contact with each other while each having the triangular and inverted triangular emission areas EMA, the bank BNK may be disposed to enclose the emission areas EMA of the pair of sub-pixels SPX while having a quadrilateral shape in the area corresponding to the pair of sub-pixels SPX. The bank BNK may have a shape in which the width of the second direction DR2 may be gradually changed in the first direction DR1.

For instance, in case that the pair of sub-pixels SPX may be symmetrically disposed in the first direction DR1 while each having the emission area EMA of an isosceles-triangular shape that may be symmetric in the second direction DR2, the bank BNK may have a diamond shape that completely encloses the emission areas EMA of the pair of sub-pixels SPX. Furthermore, in an embodiment, the bank BNK may have a shape in which it may be connected in one piece over the entire display area DA. For instance, the bank BNK may be formed in a mesh pattern including a diamond-shaped opening corresponding to the pair of sub-pixels SPX.

In an embodiment of FIG. 8, the sub-pixels SPX may be compactly arranged in the display area DA by dividing the sub-pixels SPX to a smaller size compared to the embodiment of FIG. 7 while securing the width of the sub-pixels SPX (particularly, the width of each emission area EMA to which the light emitting elements LD may be supplied) to accommodate the droplet DRL including the light emitting elements LD. Thus, a display device having high resolution may be realized.

Figure 9A:
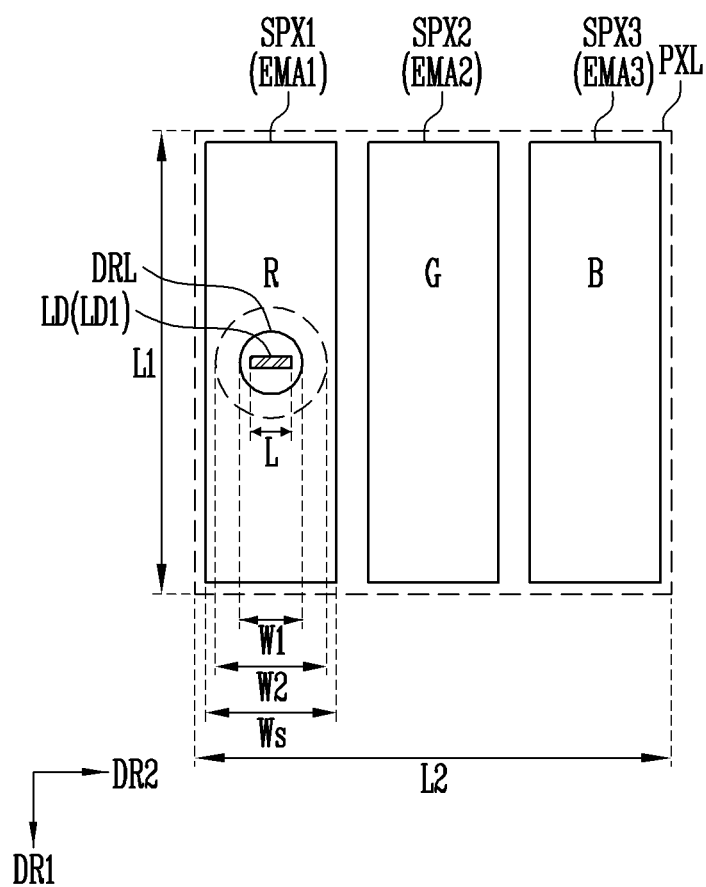
FIGS. 9a and 9b are schematic plan views illustrating a difference in resolution in accordance with the embodiments of FIGS. 7 and 8.
Figure 9B:
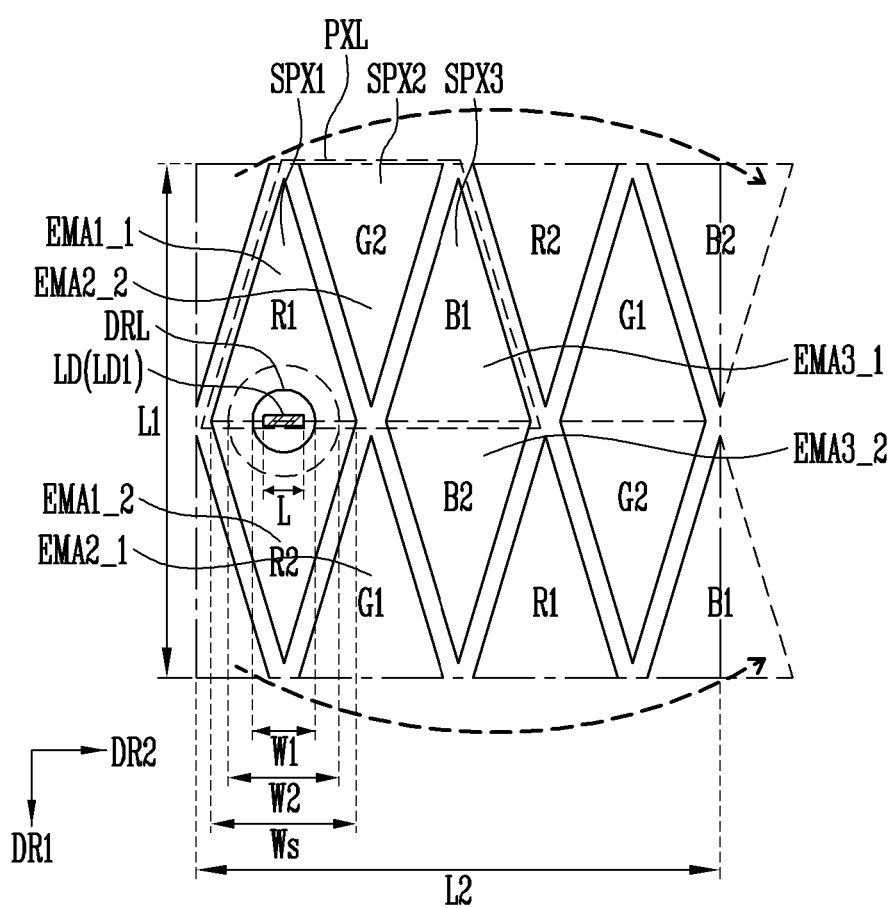

FIGS. 9a and 9b are schematic plan views illustrating a difference in resolution in accordance with the embodiments of FIGS. 7 and 8. To be more specific, FIG. 9a illustrates a pixel area in which one pixel PXL shown in FIG. 7 may be formed in consideration of the size of the droplet DRL, and FIG. 9b illustrates pixels PXL which may be disposed in an area occupied by the pixel PXL of FIG. 9a according to the embodiment of FIG. 8.

First, referring to FIGS. 4 to 7 and FIG. 9a, each pixel PXL shown in FIG. 7 may be formed in a unit pixel area having a vertical length L1 (e.g., the length of the pixel PXL) and a horizontal length L2 (e.g., the width of the pixel PXL) in the first direction DR1 and the second direction DR2. An area (e.g., L1*L2) of the unit pixel area may be variously set according to the resolution of the display device and/or the structure of the pixel PXL. The width Ws of each sub-pixel SPX (particularly, the emission area EMA of each sub-pixel SPX) in the second direction DR2 may be set to accommodate the droplet DRL of the LED solution SOL supplied to each sub-pixel SPX. For instance, in case that the droplet DRL including the light emitting elements LD has a first width W1 on average and the sum of the first width W1 and an error range (e.g., a drop error range) may be a second width W2, the emission area EMA of each sub-pixel SPX may be designed to have a width Ws of the second width W2 or more.

In other words, in case that at least one light emitting element LD may be supplied to each emission area EMA through the inkjet printing method, the emission area EMA of each sub-pixel SPX should have a width Ws larger than the first width W1 of the droplet DRL including at least one light emitting element LD. Furthermore, the first width W1 of the droplet DRL may be set to be at least greater than the length L of the light emitting element LD. For example, the droplet DRL of the LED solution SOL should be dropped into each emission area EMA, in a size sufficient to supply the light emitting elements LD to each emission area EMA. Therefore, due to the length L of the light emitting elements LD and/or the size of the droplet DRL for supplying the light emitting elements to each emission area EMA, there may be a limit to reducing the width Ws of the sub-pixel SPX (particularly, the emission area EMA).

Referring to FIGS. 4 to 9b, according to an embodiment of the disclosure, the bank BNK may be formed in a shape of a polygon that may be top and bottom symmetrical in the first direction DR1, and a pair of sub-pixels SPX that may be adjacent to each other in the vertical direction and may have the same color arranged in the bank BNK in the first direction DR1. In an embodiment, each of the pair of sub-pixels SPX having the same color (particularly, the emission areas EMA of the pair of sub-pixels SPX having the same color) may have a shape in which the width of the second direction DR2 may be gradually changed in the first direction DR1, e.g., a triangular shape (or, an inverted triangular shape). Furthermore, the pair of sub-pixels SPX having the same color may be symmetrically arranged while coming into contact with each other in an area having the maximum width, e.g., in the base where each emission area EMA has the maximum width. The bank BNK may have a quadrilateral shape, e.g., a diamond shape, which encloses the emission areas EMA of the pair of sub-pixels SPX having the same color. For example, the bank BNK may be formed in a mesh pattern including diamond-shaped openings that enclose the pair of emission areas EMA corresponding to the pair of sub-pixels SPX having the same color.

In the above-described embodiment, the display device having high resolution can be realized while the width Ws of each sub-pixel SPX may be maintained in a size sufficient to accommodate the droplet DRL including the light emitting elements LD. For example, in the embodiment of FIG. 9a, one sub-pixel SPX may be disposed in each unit area (i.e., each sub-pixel area) enclosed by the bank BNK. In contrast, in the embodiment of FIG. 9b, each unit area enclosed by the bank BNK having a symmetrical shape in the vertical direction may be divided into two areas, and the emission areas EMA of the two sub-pixels SPX having the same color and arranged continuously in the first direction DR1 may be formed in the unit area. Thus, compared with the embodiment of FIG. 9a, in the embodiment of FIG. 9b, a larger number of sub-pixels SPX, e.g., two-fold sub-pixels SPX may be arranged in the first direction DR1.

In the embodiment of FIG. 9a, each sub-pixel SPX and the bank BNK may be arranged in a quadrilateral shape. In contrast, in the embodiment of FIG. 9b, two sub-pixels SPX of the triangular shape (or the inverted triangular shape), which may be symmetrical with respect to each other so that the bases come into contact with each other, may be disposed in the diamond-shaped bank BNK. Thus, compared with the embodiment of FIG. 9a, in the embodiment of FIG.

9b, a larger number of sub-pixels SPX, e.g., two-fold sub-pixels SPX may be arranged in the second direction DR2.

In other words, compared with the embodiment of FIG. 9a, in the embodiment of FIG. 9b, a larger number of sub-pixels SPX, e.g., four-fold sub-pixels SPX may be arranged in the same area L1*L2. Thus, in the case of applying the embodiment of FIG. 9b, the display device having high resolution may be manufactured. For example, assuming that the display area DA has the same area and the maximum width Ws of each sub-pixel SPX (particularly, the emission area EMA) may be set the same, the display device using the embodiment of FIG. 9b may be manufactured to have the pixel density (e.g., pixels per inch (ppi)) that may be twice as high as that of the display device using the embodiment of FIG. 9a.

Furthermore, the bank BNK may be formed to completely enclose the emission areas EMA of the pair of sub-pixels SPX having the same color and including the light emitting elements LD of the same color, so that it may be possible to secure the space having the width Ws sufficient to accommodate the droplet DRL including the light emitting elements LD in each unit area defined by the bank BNK.

In an embodiment of the disclosure, each sub-pixel SPX may include a light source unit LSU including at least one light emitting element LD. Furthermore, the at least one light emitting element LD may be coupled between the first and second electrodes ELT1 and ELT2 disposed in each emission area EMA to be driven.

Furthermore, in an embodiment of the disclosure, even if the pair of emission areas EMA corresponding to the pair of sub-pixels SPX may not be partitioned by the bank BNK and may be completely enclosed by the bank BNK, the first electrode ELT1 and/or the second electrode ELT2 may be separately formed for each emission area EMA. Each of the pair of sub-pixels SPX may be individually driven. In other words, each of the sub-pixels SPX may form an individual sub-pixel SPX that may be independently driven.

Figure 10A:
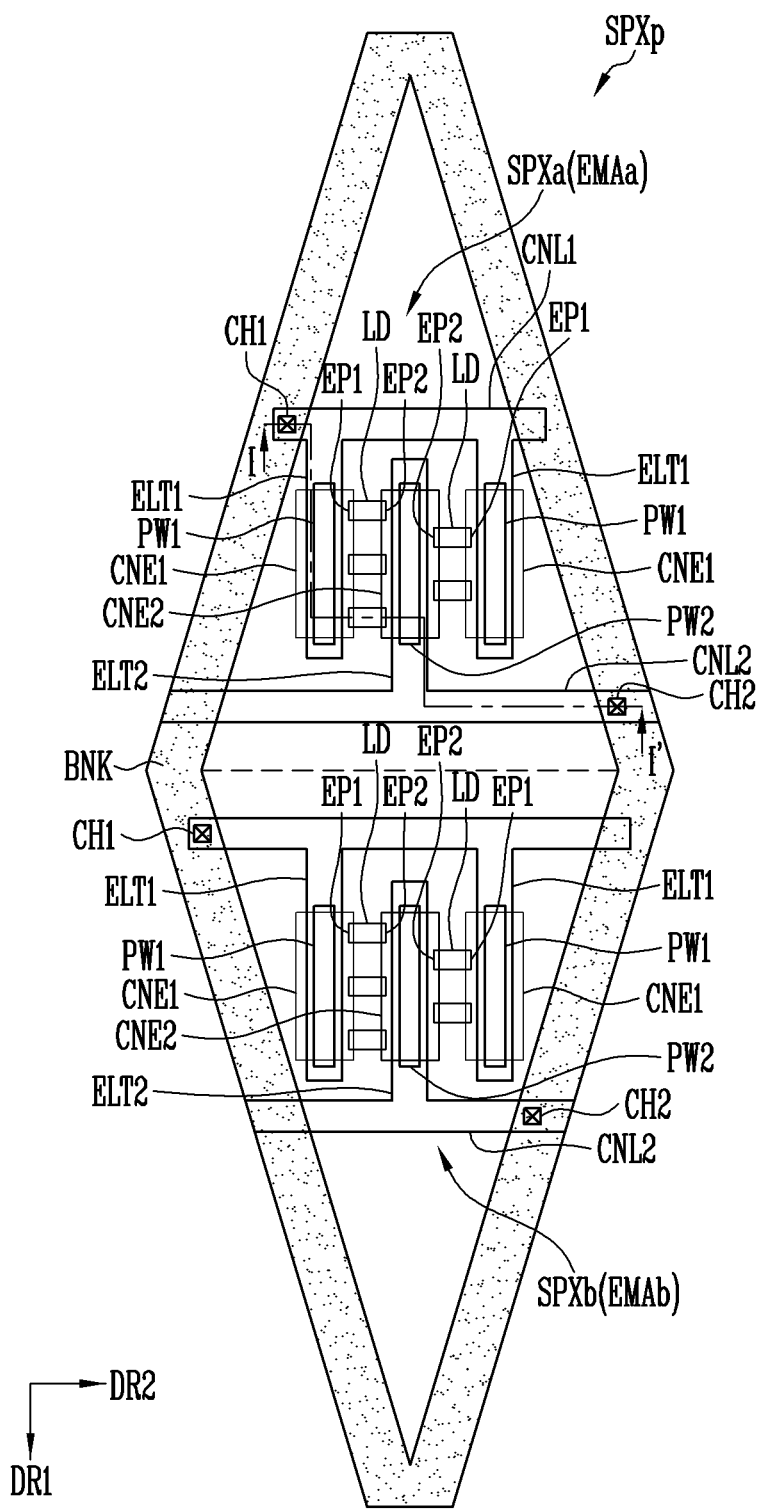
FIGS. 10a, 10b, and 11 are schematic plan views each illustrating a sub-pixel in accordance with an embodiment of the disclosure.
Figure 10B:
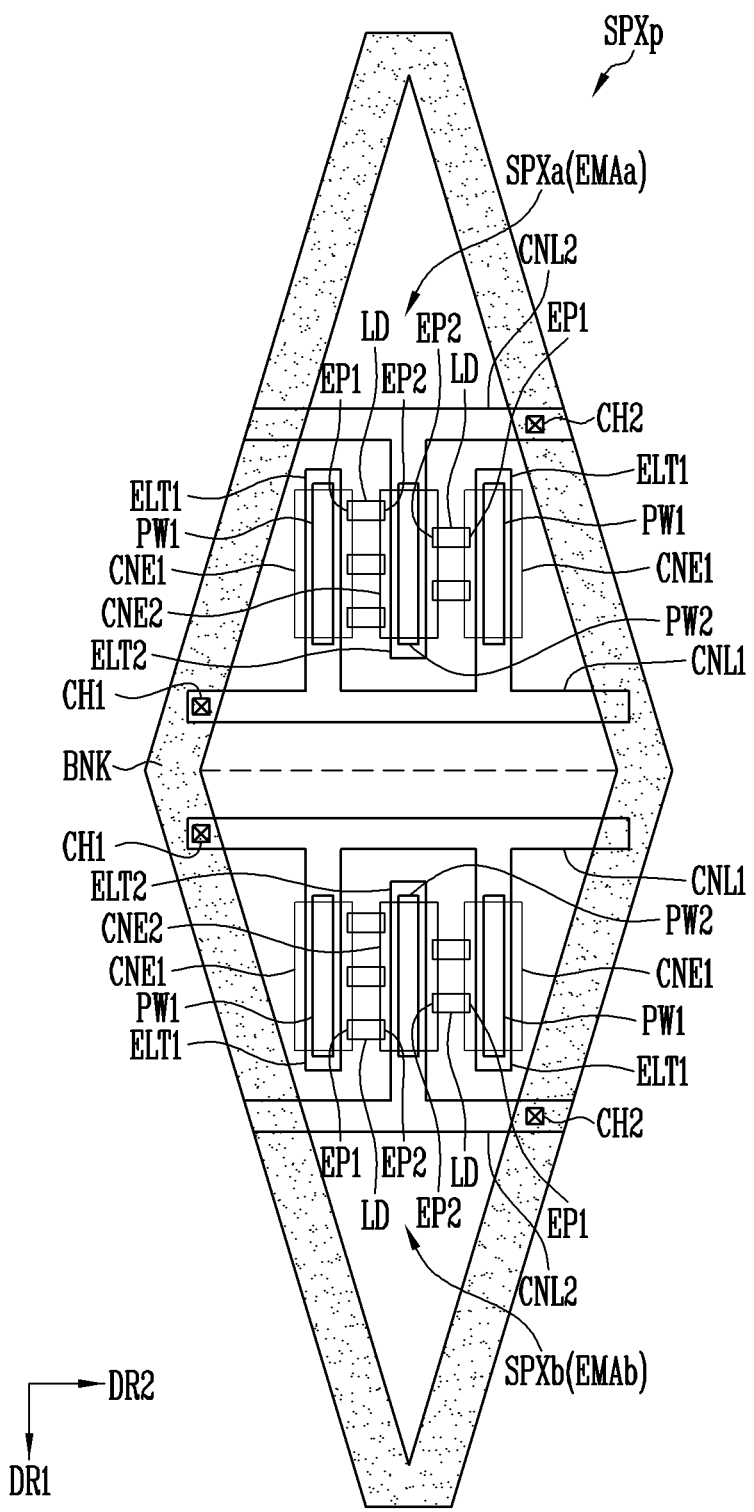
Figure 11:
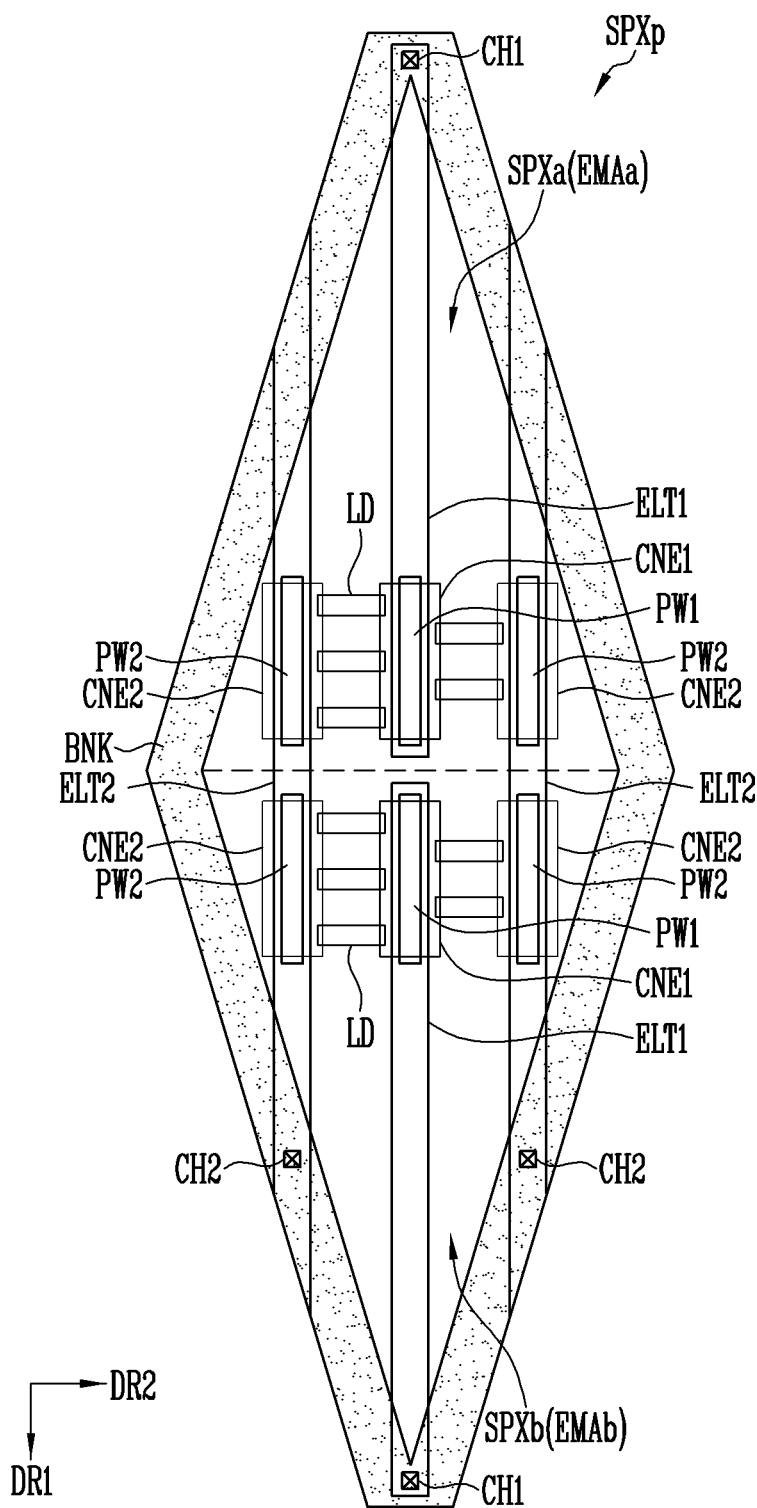

FIGS. 10a, 10b, and 11 are schematic plan views each illustrating a sub-pixel SPX in accordance with an embodiment of the disclosure. To be more specific, FIGS. 10a, 10b, and 11 are schematic plan views showing any pair of sub-pixels SPXp disposed in the display area DA according to the embodiment of FIG. 8. For instance, the pair of sub-pixels SPXp may be any of a pair of first color sub-pixels SPX1, a pair of second color sub-pixels SPX2, and a pair of third color sub-pixels SPX3, and the pair of first color sub-pixels SPX1, the pair of second color sub-pixels SPX2, and the pair of third color sub-pixels SPX3 may have substantially the same or similar structure. In an embodiment, FIGS. 10a, 10b, and 11 illustrate the structure of a pair of sub-pixels SPXp, focused on the emission area EMA in which the light emitting elements LD of each sub-pixel SPX may be arranged.

First, referring to FIGS. 4 to 10a, the pair of sub-pixels SPXp may include two sub-pixels SPXa and SPXb that may be symmetrically disposed in each emission area EMA enclosed by the bank BNK. For instance, the pair of sub-pixels SPXp may include the triangular sub-pixel (hereinafter "SPXa pixel"), and the inverted triangular sub-pixel (hereinafter "SPXb pixel") that may be symmetrical with the SPXa pixel.

In describing an embodiment of the disclosure, for convenience, the shape of the sub-pixel SPX will be described, focused on the emission area EMA in which the light emitting elements LD of each sub-pixel SPX may be arranged. For instance, the SPXa pixel may have a triangular emission area EMAa, and the SPXb pixel may have an inverted triangular emission area EMAb.

In an embodiment, each sub-pixel SPX may further include a pixel circuit area in which each pixel circuit PXC may be formed. The pixel circuit area may have a shape equal to or different from that of the emission area EMA of the corresponding sub-pixel SPX, and each pixel circuit area may at least partially overlap each emission area EMA.

In an embodiment, each sub-pixel SPX may include at least one pair of first electrode ELT1 and second electrode ELT2 disposed in each emission area EMA, and at least one light emitting element LD coupled between the first and second electrodes ELT1 and ELT2. For example, each first color sub-pixel SPX1 may include at least one pair of a first electrode ELT1 and a second electrode ELT2 disposed in each emission area EMA, and multiple first color light emitting elements LD1 coupled in parallel between the first and second electrodes ELT1 and ELT2. Likewise, each second color sub-pixel SPX2 may include at least one pair of a first electrode ELT1 and a second electrode ELT2 disposed in each emission area EMA, and multiple second color light emitting elements LD2 coupled in parallel between the first and second electrodes ELT1 and ELT2, and each third color sub-pixel SPX3 may include at least one pair of a first electrode ELT1 and a second electrode ELT2 disposed in each emission area EMA, and multiple third color light emitting elements LD3 coupled in parallel between the first and second electrodes ELT1 and ELT2.

Furthermore, in an embodiment, each sub-pixel SPX may further include a first partition wall PW1 and a first contact electrode CNE1 overlapping each first electrode ELT1, and a second partition wall PW2 and a second contact electrode CNE2 overlapping each second electrode ELT2. Each sub-pixel SPX may further include a first connection electrode CNL1 coupled to the first electrode ELT1, and a second connection electrode CNL2 coupled to the second electrode ELT2.

In an embodiment, the first electrode ELT1 and the second electrode ELT2 may be disposed in each emission area EMA to be spaced apart from each other, and be disposed such that at least portions thereof face each other. For example, the first and second electrodes ELT1 and ELT2 may be disposed in each emission area EMA to extend in the first direction DR1, and may be disposed side by side to be spaced apart from each other by a distance in the second direction DR2 intersecting with the first direction DR1. However, the disclosure is not limited thereto. For example, the shapes and/or mutual disposition relationship of the first and second electrodes ELT1 and ELT2 may be changed in various ways.

In an embodiment, each of the first and second electrodes ELT1 and ELT2 may have a single-layer or multi-layer structure. For instance, each first electrode ELT1 may have the multi-layer structure including a first reflective electrode and a first conductive capping layer, and each second electrode ELT2 may have the multi-layer structure including a second reflective electrode and a second conductive capping layer.

In an embodiment, the first electrode ELT1 may be coupled to the first connection electrode CNL1. For instance, the first electrode ELT1 may be integrally coupled to the first connection electrode CNL1. For example, the first electrode ELT1 may be formed of at least one branch diverging from the first connection electrode CNL1. In the case where the first electrode ELT1 and the first connection electrode CNL1 may be integrated with each other, the first connection electrode CNL1 may be regarded as an area of the first electrode ELT1. However, the disclosure is not limited thereto. For example, in another embodiment of the disclosure, the first electrode ELT1 and the first connection electrode CNL1 may be separately formed from each other and electrically coupled to each other through, e.g., at least one contact hole or via hole (not shown).

In an embodiment, the first electrode ELT1 and the first connection electrode CNL1 may extend in different directions in the corresponding emission area EMA. For example, in case that the first electrode ELT1 extends in the first direction DR1, the first connection electrode CNL1 may extend in the second direction DR2 intersecting with the first direction DR1. In an embodiment, the first connection electrode CNL1 may have a single-layer or multi-layer structure. For instance, the first connection electrode CNL1 may have the same sectional structure as the first electrode ELT1.

In an embodiment, the first electrode ELT1 and the first connection electrode CNL1 may be connected to the pixel circuit PXC of each sub-pixel SPX, e.g., the pixel circuit PXC configured as illustrated in any of FIGS. 5a to 5c through the first contact hole CH1. In an embodiment, the first contact hole CH1 may be disposed in a periphery of each emission area EMA. For instance, the first contact hole CH1 may be disposed around the corresponding emission area EMA to overlap the bank BNK. It may be possible to prevent a pattern from being reflected while the first contact hole CH1 may be covered by the bank BNK. However, the disclosure is not limited thereto. For example, in another embodiment of the disclosure, at least one first contact hole CH1 may be disposed in the emission area EMA.

In an embodiment, each pixel circuit PXC may be disposed under the light emitting elements LD disposed in the corresponding emission area EMA. For example, each pixel circuit PXC may be formed in a pixel circuit layer under the light emitting elements LD to be coupled to the first electrode ELT1 through the first contact hole CH1.

In an embodiment, the second electrode ELT2 may be coupled to the second connection electrode CNL2. For instance, the second electrode ELT2 may be integrally coupled to the second connection electrode CNL2. For example, the second electrode ELT2 may be formed of at least one branch diverging from the second connection electrode CNL2. In the case where the second electrode ELT2 and the second connection electrode CNL2 may be integrally formed, the second connection electrode CNL2 may be regarded as an area of the second electrode ELT2. However, the disclosure is not limited thereto. For example, in another embodiment of the disclosure, the second electrode ELT2 and the second connection electrode CNL2 may be separately formed from each other and electrically coupled to each other through, e.g., at least one contact hole or via hole (not shown).

In an embodiment, the second electrode ELT2 and the second connection electrode CNL2 may extend in different directions in the corresponding emission area EMA. For example, in case that the second electrode ELT2 extends in the first direction DR1, the second connection electrode CNL2 may extend in the second direction DR2 intersecting with the first direction DR1. In an embodiment, the second connection electrode CNL2 may have a single-layer or multi-layer structure. For instance, the second connection electrode CNL2 may have the same sectional structure as the second electrode ELT2.

In an embodiment, the second electrode ELT2 and the second connection electrode CNL2 may be coupled to the second power supply VSS. For example, the second electrode ELT2 and the second connection electrode CNL2 may be coupled to the second power supply VSS via the second contact hole CH2 and a power line (not shown) coupled thereto. In an embodiment, the second contact hole CH2 may be disposed in the periphery of each emission area EMA. For instance, the second contact hole CH2 may be disposed around the corresponding emission area EMA to overlap the bank BNK. It may be possible to prevent a pattern from being reflected while the second contact hole CH2 may be covered by the bank BNK. However, the disclosure is not limited thereto. For example, in another embodiment of the disclosure, at least one second contact hole CH2 may be disposed in the emission area EMA.

In an embodiment, an area of the power line for supplying the second power supply VSS may be disposed in the pixel circuit layer under the light emitting elements LD. For example, the power line may be disposed in the pixel circuit layer under the light emitting elements LD to be coupled to the second electrode ELT2 through the second contact hole CH2. However, the disclosure is not limited thereto, and the position of the power line may be variously changed.

In an embodiment, the first partition wall PW1 may be disposed under the first electrode ELT1 to overlap an area of the first electrode ELT1. The second partition wall PW2 may be disposed under the second electrode ELT2 to overlap an area of the second electrode ELT2. The first and second partition walls PW1 and PW2 may be disposed in each emission area EMA at positions spaced apart from each other, and respectively make areas of the first and second electrode ELT1 and ELT2 protrude upward. For example, the first electrode ELT1 may be disposed on the first partition wall PW1, thus protruding by the first partition wall PW1 in the height direction. The second electrode ELT2 may be disposed on the second partition wall PW2, thus protruding by the second partition wall PW2 in the height direction.

In an embodiment, at least one light emitting element LD, e.g., multiple light emitting elements LD, may be arranged between the first and second electrodes ELT1 and ELT2 of each sub-pixel SPX. For example, at least one first color light emitting element LD1 may be disposed between the first and second electrodes ELT1 and ELT2 of the first sub-pixel SPX1. At least one second color light emitting element LD2 may be disposed between the first and second electrodes ELT1 and ELT2 of the second sub-pixel SPX2. At least one third color light emitting element LD3 may be disposed between the first and second electrodes ELT1 and ELT2 of the third sub-pixel SPX3. For instance, in each emission area EMA, the light emitting elements LD may be coupled in parallel in an area where the first electrode ELT1 and the second electrode ELT2 may be disposed to face each other.

Although in FIG. 10a all of the light emitting elements LD have been illustrated as being arranged in the second direction DR2, e.g., in the horizontal direction, the arrangement direction of the light emitting elements LD is not limited thereto. For example, at least one of the light emitting elements LD may be disposed in a diagonal direction.

The light emitting elements LD may be electrically coupled between the first and second electrodes ELT1 and ELT2 of the corresponding sub-pixel SPX. For example, a first end EP1 of each light emitting element LD may be electrically coupled to the first electrode ELT1 of the corresponding sub-pixel SPX, and a second end EP2 of the light emitting element LD may be electrically coupled to the second electrode ELT2 of the corresponding sub-pixel SPX.

In an embodiment, the first ends of the light emitting elements LD may be electrically coupled to the corresponding first electrode ELT1 through at least one contact electrode, e.g., a first contact electrode CNE1, rather than being disposed on (e.g., directly disposed on) the first electrode ELT1. However, the disclosure is not limited thereto. For example, in another embodiment of the disclosure, the first ends EP1 of the light emitting elements LD may come into direct contact with the corresponding first electrode ELT1 and be electrically coupled to the first electrode ELT1.

Likewise, the second ends EP2 of the light emitting elements LD may be electrically coupled to the corresponding second electrode ELT2 through at least one contact electrode, e.g., a second contact electrode CNE2, rather than being disposed on (e.g., directly disposed on) the second electrode ELT2. However, the disclosure is not limited thereto. For example, in another embodiment of the disclosure, the second ends EP2 of the light emitting elements LD may come into direct contact with the corresponding second electrode ELT2 and be electrically coupled to the second electrode ELT2.

In an embodiment, each of the light emitting elements LD may be formed of a light emitting diode which may be made of material having an inorganic crystal structure and may have a subminiature size, e.g., ranging from a nano scale to a micro scale. For example, each of the first, second, and third color light emitting elements LD1, LD2, and LD3 may be formed of a subminiature rod-type light emitting diode ranging from the nano-scale to the micro-scale, which is shown in any of FIGS. 1a and 1b, FIGS. 2a and 2b, and FIGS. 3a and 3b.

In an embodiment, the light emitting elements LD may be prepared in a diffused form in an LED solution SOL, and supplied to each emission area EMA by an inkjet printing method or the like. For example, the light emitting elements LD may be mixed with a volatile solvent and supplied to each emission area EMA. Here, if a voltage is supplied through the first and second electrodes ELT1 and ELT2 of each sub-pixel SPX, an electric field may be formed between the first and second electrodes ELT1 and ELT2, whereby the light emitting elements LD may be aligned between the first and second electrodes ELT1 and ELT2. After the light emitting elements LD have been aligned, the solvent may be removed by a volatilization method or other methods. In this way, the light emitting elements LD may be reliably arranged between the first and second electrodes ELT1 and ELT2. Furthermore, since the first contact electrode CNE1 and the second contact electrode CNE2 may be respectively formed on the first and second ends EP1 and EP2 of the light emitting elements LD, the light emitting elements LD may be reliably coupled between the first and second electrodes ELT1 and ELT2.

In an embodiment, each first contact electrode CNE1 may be formed on both the first ends EP1 of the light emitting elements LD and at least a portion of the corresponding first electrode ELT1, whereby the first ends EP1 of the light emitting elements LD may be physically and/or electrically coupled to the first electrode ELT1. Likewise, each second contact electrode CNE2 may be formed on both the second ends EP2 of the light emitting elements LD and at least a portion of the corresponding second electrode ELT2, whereby the second ends EP2 of the light emitting elements LD may be physically and/or electrically coupled to the second electrode ELT2.

The light emitting elements LD disposed in each emission area EMA may gather, thus forming the light source unit LSU of the corresponding sub-pixel SPX. For example, if driving current flows through at least one sub-pixel SPX during each frame period, the light emitting elements LD that are coupled in the forward direction between the first and second electrodes ELT1 and ELT2 of the sub-pixel SPX may emit light having a luminance corresponding to the driving current.

In an embodiment, the pair of emission areas EMA corresponding to the pair of sub-pixels SPXp may be completely enclosed by the bank BNK. The first electrode ELT1 and/or the second electrode ELT2 of each sub-pixel SPX may be formed separately for each emission area EMA.

For example, the first electrodes ELT1 of each of the SPXa pixel and the SPXb pixel constituting any pair of sub-pixels SPXp may be separated from each other. For instance, the first electrodes ELT1 of the sub-pixels SPX disposed in the display area DA including the SPXa pixel and the SPXb pixel may be integrated with each other to be supplied with alignment voltage during the alignment process of the light emitting elements LD, and be separated into individual patterns for each emission area EMA. Thus, the first electrode ELT1 of the SPXa pixel may be individually disposed in the emission area EMAa corresponding to the SPXa pixel, and the first electrode ELT1 of the SPXb pixel may be individually disposed in the emission area EMAb corresponding to the SPXb pixel.

The second electrodes ELT2 of the sub-pixels SPX may be separated from each other or coupled to each other. For example, the second electrodes ELT2 of the sub-pixels SPX may be directly/indirectly coupled to each other over the entire display area DA.

In an embodiment of the disclosure, the first and second electrodes ELT1 and ELT2 of each of the sub-pixels SPX may be repeated in a substantially constant pattern regardless of the shape of the corresponding emission area EMA. For example, the first electrodes ELT1 disposed in the pair of sub-pixels SPXp, i.e., the first electrode ELT1 of the SPXa pixel and the first electrode ELT1 of the SPXb pixel may have substantially the same shape. Furthermore, the second electrodes ELT2 disposed in the pair of sub-pixels SPXp, i.e., the second electrode ELT2 of the SPXa pixel and the second electrode ELT2 of the SPXb pixel may have substantially the same shape. The first and second connection electrodes CNL1 and CNL2 of each of the sub-pixels SPX may be repeated in a constant pattern regardless of the shape of the corresponding emission area EMA, or may have a length matching the shape of the corresponding emission area EMA. For instance, the first connection electrode CNL1 of the SPXa pixel may be shorter than the first connection electrode CNL1 of the SPXb pixel, while the second connection electrode CNL2 of the SPXa pixel may be longer than the second connection electrode CNL2 of the SPXb pixel.

However, the disclosure is not limited thereto. In other words, the shape of the first electrodes ELT1 and/or the second electrodes ELT2 may be variously changed.

For example, as illustrated in FIG. 10b, in another embodiment of the disclosure, the first and second electrodes ELT1 and ELT2 and/or the first and second connection electrodes CNL1 and CNL2 disposed in the pair of sub-pixels SPXp may have a shape in which they may be symmetrical with each other to match the shape of each emission area EMA. For instance, the first electrodes ELT1 and the first connection electrodes CNL1 disposed in the pair of sub-pixels SPXp, i.e., the first electrode ELT1 and the first connection electrode CNL1 of the SPXa pixel and the first electrode ELT1 and the first connection electrode CNL1 of the SPXb pixel may have a shape in which they may be symmetrical with each other with respect to a boundary line along which the pair of sub-pixels SPXp (particularly, their emission areas EMA) come into contact with each other. Likewise, the second electrodes ELT2 and the second connection electrodes CNL2 disposed in the pair of sub-pixels SPXp, i.e., the second electrode ELT2 and the second connection electrode CNL2 of the SPXa pixel and the second electrode ELT2 and the second connection electrode CNL2 of the SPXb pixel may have a shape in which they may be symmetrical with each other with respect to the boundary line along which the pair of sub-pixels SPXp come into contact with each other.

FIGS. 10a and 10b illustrate an embodiment where the first electrode ELT1 extending in the first direction DR1 and the first connection electrode CNL1 extending in the second direction DR2 may be integrally coupled to each other, and similarly, the second electrode ELT2 extending in the first direction DR1 and the second connection electrode CNL2 extending in the second direction DR2 may be integrally coupled to each other. However, the disclosure is not limited thereto. For example, as illustrated in FIG. 11, each first electrode ELT1 and/or each second electrode ELT2 may have the shape of a bar extending in any direction (e.g., first direction DR1). In an embodiment, the first and second electrodes ELT1 and ELT2 disposed in each emission area EMA may be arranged parallel to each other. However, the disclosure is not limited thereto.

Furthermore, in an embodiment, the first electrodes ELT1 disposed in each emission area EMA may be separated from each other, and be coupled to each pixel circuit PXC through each first contact hole CH1 in each sub-pixel SPX. Furthermore, the second electrodes ELT2 of the sub-pixels SPX may be formed to be coupled to each other. The second contact hole CH2 for coupling the second electrodes ELT2 to the second power line or the like may be formed for each sub-pixel SPX, or one second contact hole may be formed for each of the sub-pixels SPX. In another embodiment, the second contact hole CH2 may be formed outside the display area DA. In other words, in the disclosure, the internal structure of the sub-pixels SPX may be variously changed.

Figure 12:
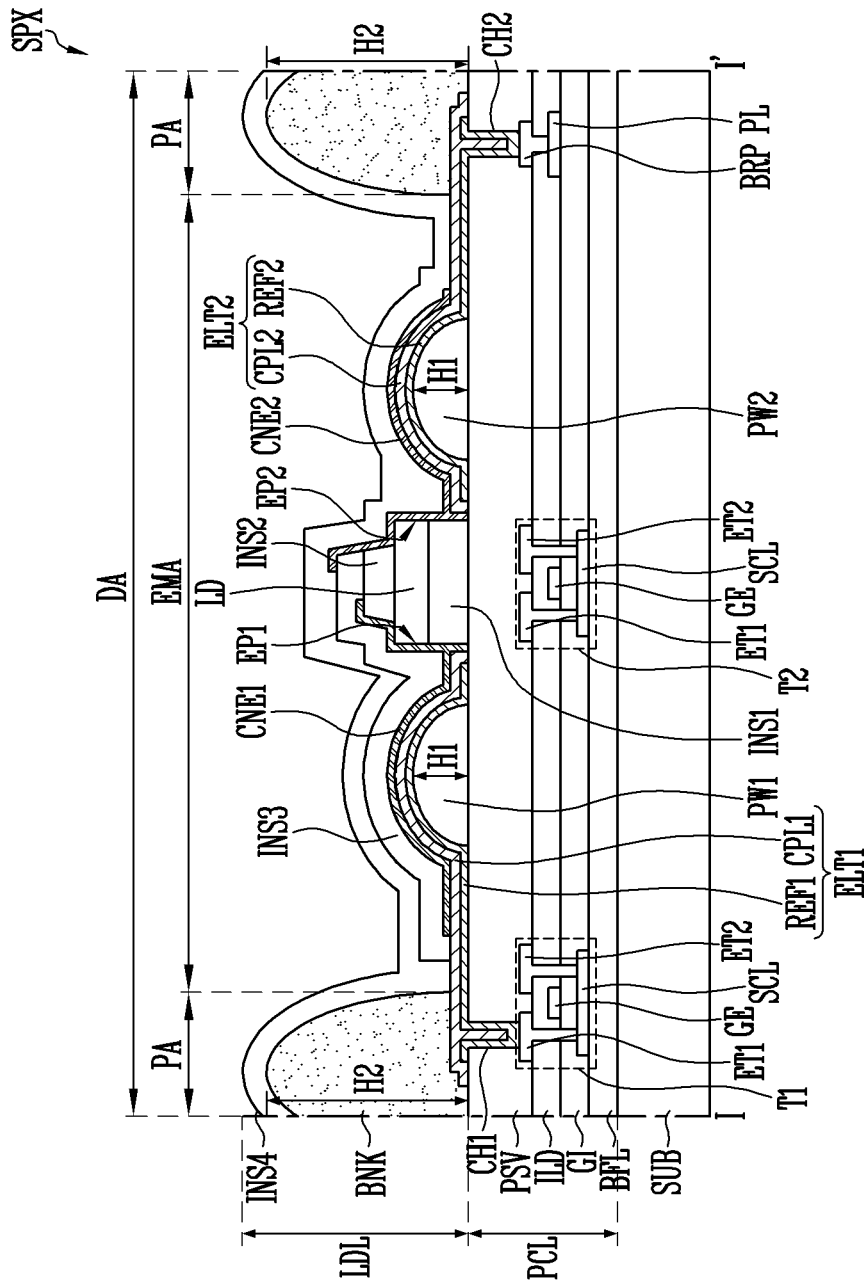
FIGS. 12 and 13 are schematic sectional views each illustrating the structure of a sub-pixel in accordance with an embodiment of the disclosure. For example.
Figure 13:
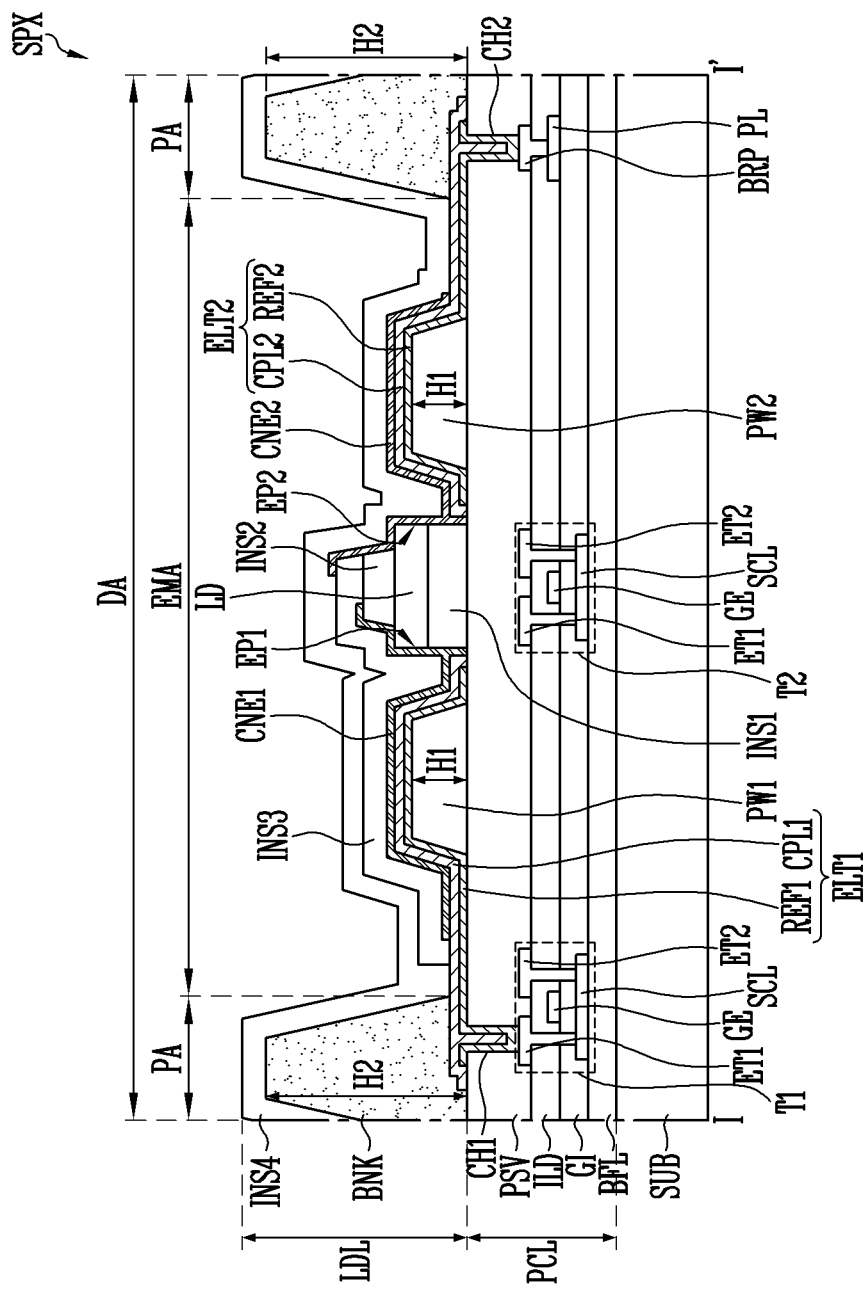

FIGS. 12 and 13 are schematic sectional views each illustrating the structure of a sub-pixel SPX in accordance with an embodiment of the disclosure. For example, FIGS. 12 and 13 are sectional views taken along line I-I' of FIG. 10a in accordance with different embodiments. To be more specific, FIGS. 12 and 13 show different embodiments concerning the shape of the first and second partition walls PW1 and PW2 and the bank BNK.

In an embodiment, FIGS. 12 and 13 illustrate the section of the SPXa pixel of FIG. 10a, as an example of any sub-pixel SPX. The sectional structures of the sub-pixels SPX disposed in the display area DA may be substantially identical or similar to each other. Thus, for convenience, FIGS. 12 and 13 comprehensively illustrate the structure of each sub-pixel SPX, through the section of the SPXa pixel corresponding to line I-I' of FIG. 10a.

Referring to FIGS. 12 and 13 along with FIGS. 1 to 11, a pixel circuit layer PCL and a display element layer LDL may be successively placed on the substrate SUB of the display panel PNL. In an embodiment, the pixel circuit layer PCL and the display element layer LDL may be formed throughout the entire display area DA.

In an embodiment, the pixel circuit layer PCL may include circuit elements which may form the pixel circuit PXC of each of the sub-pixels SPX. The display element layer LDL may include light emitting elements LD of each of the sub-pixels SPX.

In an embodiment, the pixel circuit layer PCL may include multiple circuit elements disposed in the display area DA. For example, the pixel circuit layer PCL may include circuit elements that may be formed in each emission area EMA and/or a peripheral area PA of the emission area EMA to constitute the pixel circuit PXC of each sub-pixel SPX. For instance, the pixel circuit layer PCL may include multiple transistors disposed in each emission area EMA and/or the peripheral area PA thereof, e.g., first and second transistors T1 and T2 of FIGS. 5a and 5b. Although not illustrated in FIGS. 12 and 13, the pixel circuit layer PCL may include a storage capacitor Cst disposed in each sub-pixel area (e.g., an area including the emission area EMA and the pixel circuit area of each sub pixel SPX), various signal lines (e.g., the scan line Si and the data line Dj of FIGS. 5a and 5b) coupled to each pixel circuit PXC, and various power lines (e.g., a first power line (not illustrated) and a second power line PL for transmitting the first power supply VDD and the second power supply VSS, respectively) coupled to the pixel circuit PXC and/or the light emitting elements LD.

In an embodiment, transistors, e.g., first and second transistors T1 and T2, provided in each pixel circuit PXC may have substantially an identical or similar sectional structure. However, the disclosure is not limited thereto. In another embodiment, at least some of the transistors may have different types and/or structures.

The pixel circuit layer PCL may include insulating layers. For example, the pixel circuit layer PCL may include a buffer layer BFL, a gate insulating layer GI, an interlayer insulating layer ILD, and a passivation layer PSV which may be successively stacked on one surface of the substrate SUB.

In an embodiment, the buffer layer BFL may prevent impurities from diffusing into each circuit element. The buffer layer BFL may be formed of a single layer, or may be formed of multiple layers having at least two layers. In the case where the buffer layer BFL has the multilayer structure, the respective layers may be formed of the same material or different materials. In an embodiment, the buffer layer BFL may be omitted.

In an embodiment, each of the first and second transistors T1 and T2 may include a semiconductor layer SCL, a gate electrode GE, a first transistor electrode ET1, and a second transistor electrode ET2. Although FIGS. 12 and 13 illustrate an embodiment in which each of the first and second transistors T1 and T2 may include the first transistor electrode ET1 and the second transistor electrode ET2 that may be formed separately from the semiconductor layer SCL, the disclosure is not limited thereto. For example, in another embodiment of the disclosure, the first and/or second transistor electrodes ET1 and/or ET2 provided in at least one transistor forming each pixel circuit PXC may be integrally formed with the corresponding semiconductor layer SCL.

The semiconductor layer SCL may be disposed on the buffer layer BFL. For example, the semiconductor layer SCL may be disposed between the gate insulating layer GI and the substrate SUB on which the buffer layer BFL may be formed. The semiconductor layer SCL may include a first area which comes into contact with the first transistor electrode ET1, a second area which comes into contact with the second transistor electrode ET2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, etc., or a combination thereof. The channel region of the semiconductor layer SCL may be an intrinsic semiconductor, which may be an undoped semiconductor pattern. Each of the first and second areas of the semiconductor layer SCL may be a semiconductor pattern doped with an impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD to overlap at least a portion of the semiconductor layer SCL.

The first and second transistor electrodes ET1 and ET2 may be disposed on the semiconductor layer SCL and the gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically coupled to the semiconductor layer SCL. For example, the first and second transistor electrodes ET1 and ET2 may be respectively coupled to the first area and the second area of the semiconductor layer SCL through corresponding contact holes which pass through the gate insulating layer GI and the interlayer insulating layer ILD.

In an embodiment, any of the first and second transistor electrodes ET1 and ET2 of at least one transistor (e.g., the first transistor T1 of FIGS. 5a and 5b) provided on the pixel circuit PXC may be electrically coupled, through the first contact hole CH1 passing through the passivation layer PSV, to the first electrode ELT1 of the light source unit LSU disposed on the passivation layer PSV.

In an embodiment, at least one signal line and/or power line that may be coupled to each sub-pixel SPX may be disposed on a layer identical with that of one electrode of each of the circuit elements that may form the pixel circuit PXC. For example, the power line PL for supplying the second power supply VSS may be disposed on a layer identical with that of the gate electrodes GE of the first and second transistors T1 and T2, and electrically coupled to the second electrode ELT2 of the light source unit LSU that may be disposed on the passivation layer PSV, both through a bridge pattern BRP disposed on the same layer as that of the first and second transistor electrodes ET1 and ET2 and through at least one second contact hole CH2 passing through the passivation layer PSV. However, the structures and/or positions of the power line PL, etc. may be changed in various ways.

In an embodiment, the display element layer LDL may include light emitting elements LD disposed over the pixel circuit layer PCL in each emission area EMA. Furthermore, the display element layer LDL may further include at least one insulating layer and/or insulating pattern disposed around the light emitting elements LD.

For example, the display element layer LDL may include the first and second electrodes ELT1 and ELT2 disposed in each emission area EMA, the light emitting elements LD disposed between the first and second electrodes ELT1 and ELT2 corresponding to each other, and the first and second contact electrodes CNE1 and CNE2 respectively disposed on first and second ends EP1 and EP2 of the light emitting elements LD. The display element layer LDL may further include, e.g., at least one conductive layer and/or at least one insulating layer (or insulating pattern). For example, the display element layer LDL may further include at least one of the first and second partition walls PW1 and PW2, the bank BNK, and the first to fourth insulating layers INS1, INS2, INS3, and INS4.

In an embodiment, the first and second partition walls PW1 and PW2 may be disposed on the pixel circuit layer PCL. For instance, the first and second partition walls PW1 and PW2 may be disposed on respective emission areas EMA to be spaced apart from each other by a distance.

In an embodiment, each of the first and second partition walls PW1 and PW2 may include insulating material having inorganic material or organic material. Furthermore, each of the first and second partition walls PW1 and PW2 may have a single-layer structure or a multi-layer structure. In other words, the material and/or the stacked structure of each of the first and second partition walls PW1 and PW2 may be changed in various ways rather than being particularly limited.

In an embodiment, each of the first and second partition walls PW1 and PW2 may have various shapes. For example, as illustrated in FIG. 12, each of the first and second partition walls PW1 and PW2 may have a semi-circular or semi-elliptical section, the width of which may be gradually reduced upwards. Each of the first and second partition walls PW1 and PW2 may have a curved surface on at least one side. In another embodiment, as shown in FIG. 13, each of the first and second partition walls PW1 and PW2 may have a trapezoidal section, the width of which may be gradually reduced upwards. Each of the first and second partition walls PW1 and PW2 may have an inclined surface on at least one side. In other words, in the disclosure, the shape of each of the first and second partition walls PW1 and PW2 may be changed in various ways rather than being particularly limited.

In an embodiment, the first and second electrodes ELT1 and ELT2 and the first and second connection electrodes CNL1 and CNL2 may be disposed in each emission area EMA provided with the first and second partition walls PW1 and PW2.

In an embodiment, the first and second electrodes ELT1 and ELT2 may be disposed at positions spaced apart from each other by a distance on the substrate SUB on which the pixel circuit layer PCL and/or the first and second partition walls PW1 and PW2 have been formed. The first and second connection electrodes CNL1 and CNL2 may be respectively integrally coupled with the first and second electrodes ELT1 and ELT2.

In an embodiment, the first electrodes ELT1 may be disposed on the respective first partition walls PW1, and the second electrodes ELT2 may be disposed on the respective second partition walls PW2. In an embodiment, any of the first and second electrodes ELT1 and ELT2 may be an anode electrode, and the other may be a cathode electrode.

The first and second electrodes ELT1 and ELT2 may respectively have shapes corresponding to those of the first and second partition walls PW1 and PW2. For example, each first electrode ELT1 may protrude in a height direction of the substrate SUB by the corresponding first partition wall PW1 and have a curved or inclined surface corresponding to the section of the first partition wall PW1. Furthermore, each first electrode ELT1 may be formed of a single-layer or multi-layer structure. For instance, each first electrode ELT1 may include a first reflective electrode REF1 that protrudes in the height direction of the substrate SUB by the first partition wall PW1 disposed thereunder and faces the first end EP1 of the adjacent light emitting element LD, and a first conductive capping layer CPL1 that may be selectively disposed above the first reflective electrode REF1. In an embodiment, the first reflective electrode REF1 may include at least one reflective conductive layer. The first reflective electrode may selectively further include an additional conductive layer, e.g., at least one transparent electrode layer.

Likewise, each second electrode ELT2 may protrude in the height direction of the substrate SUB by the corresponding second partition wall PW2 and have a curved or inclined surface corresponding to the section of the second partition wall PW2. For instance, each second electrode ELT2 may include a second reflective electrode REF2 that protrudes in the height direction of the substrate SUB by the second partition wall PW2 disposed thereunder and faces the second end EP2 of the adjacent light emitting element LD, and a second conductive capping layer CPL2 that may be selectively disposed above the second reflective electrode REF2. In an embodiment, the second reflective electrode REF2 may include at least one reflective conductive layer. The second reflective electrode may selectively further include an additional conductive layer, e.g., at least one transparent electrode layer.

In an embodiment, the first and second partition walls PW1 and PW2 may have the same height H1, so that the first and second electrodes ELT1 and ELT2 may have the same height. As such, if the first and second electrodes ELT1 and ELT2 have the same height, the light emitting elements LD may be more reliably coupled between the first and second electrodes ELT1 and ELT2. However, the disclosure is not limited thereto. For example, the shapes, structures and/or mutual disposition relationship of the first and second electrodes ELT1 and ELT2 may be changed in various ways.

In an embodiment, each of the first and second reflective electrodes REF1 and REF2 may include conductive material having reflectivity. For example, each of the first and second reflective electrodes REF1 and REF2 may include at least one of metals such as Ag, Mg, Al, Pt, Pd, Au, Ni, Nd, Ir, Cr, and an alloy thereof; however, the disclosure is not limited thereto. In other words, each of the first and second reflective electrodes REF1 and REF2 may include various reflective conductive materials.

The first and second reflective electrodes REF1 and REF2 may make it possible for light emitted from the opposite ends of each light emitting element LD, i.e., the first and second ends EP1 and EP2 of each light emitting element LD to propagate in a direction (e.g., in a frontal direction of the display panel PNL) in which an image may be displayed. Particularly, if each of the first and second reflective electrodes REF1 and REF2 has a curved or inclined surface corresponding to the shape of the corresponding one of the first and second partition walls PW1 and PW2, light emitted from the first and second ends EP1 and EP2 of each light emitting element LD may be reflected by the first and second reflective electrodes REF1 and REF2, whereby the light may more effectively propagate in the frontal direction (e.g., the upward direction of the substrate SUB) of the display panel PNL. Thereby, the efficiency of light emitted from the light emitting elements LD may be enhanced.

The first and second conductive capping layers CPL1 and CPL2 may be selectively disposed above the first and second reflective electrodes REF1 and REF2. For instance, the first conductive capping layer CPL1 may be disposed on the first reflective electrode REF1 to cover the first reflective electrode REF1, and the second conductive capping layer CPL2 may be disposed on the second reflective electrode REF2 to cover the second reflective electrode REF2.

Each of the first and second conductive capping layers CPL1 and CPL2 may be formed of transparent conductive material such as ITO or IZO so as to minimize loss of light emitted from the light emitting elements LD. However, the disclosure is not limited thereto. For example, the material of the first and second conductive capping layers CPL1 and CPL2 may be changed in various ways.

The first and second conductive capping layers CPL1 and CPL2 may prevent the first and second reflective electrodes REF1 and REF2 from being damaged due to a failure or the like which may occur during a process of manufacturing the display panel PNL. Furthermore, the first and second conductive capping layers CPL1 and CPL2 may enhance adhesive force between the substrate SUB provided with the pixel circuit layer PCL, etc. and the first and second reflective electrodes REF1 and REF2. In an embodiment, at least one of the first and second conductive capping layers CPL1 and CPL2 may be omitted.

In an embodiment, a first insulating layer INS1 may be disposed in each emission area EMA in which the first and second electrodes ELT1 and EL2 may be disposed. In an embodiment, the first insulating layer INS1 may be disposed between the pixel circuit layer PCL and the light emitting elements LD. The first insulating layer INS1 may function stably support the light emitting elements LD and prevent the light emitting elements LD from being displaced from correct positions thereof. In an embodiment, the first insulating layer INS1 may be formed in an independent pattern on a portion (e.g., a portion between the first and second electrodes ELT1 and ELT2) of the emission area EMA, but the disclosure is not limited thereto.

In an embodiment, at least one light emitting element LD, e.g., multiple light emitting elements LD may be supplied and aligned in each emission area EMA in which the first insulating layer INS1 may be disposed. In an embodiment, the light emitting elements LD may be self-aligned by an electric field formed between the first and second electrodes ELT1 and ELT2 in case that voltages are applied to the first and second electrodes ELT1 and ELT2. Hence, the light emitting elements LD may be arranged between the first and second electrodes ELT1 and ELT2 of the corresponding emission area EMA.

The shape and/or the structure of each of the light emitting elements LD is not limited to embodiments shown in FIGS. 12 and 13. For example, each light emitting element LD may have various well-known shapes, sectional structures and/or connection structures.

In an embodiment, a second insulating layer INS2 covering portions of respective upper surfaces of the light emitting elements LD may be disposed in each emission area EMA provided with the light emitting elements LD. In an embodiment, the second insulating layer INS2 may be selectively disposed on only upper portions of the light emitting elements LD without covering at least the opposite ends, i.e., the first and second ends EP1 and EP2, of the light emitting elements LD. The second insulating layer INS2 may be formed in an independent pattern on a portion of the emission area EMA; however, the disclosure is not limited thereto.

In an embodiment, the first contact electrode CNE1 may be disposed in each emission area EMA provided with the second insulating layer INS2. In an embodiment, the first contact electrode CNE1 may be disposed on the first electrode ELT1 to come into contact with a portion of the first electrode ELT1 disposed in the corresponding emission area EMA. Furthermore, the first contact electrode CNE1 may be disposed on the first end EP1 of at least one light emitting element LD disposed in the corresponding emission area EMA to come into contact with the first end EP1. Due to the first contact electrode CNE1, the first end EP1 of at least one light emitting element LD disposed in each emission area EMA may be electrically coupled to the first electrode ELT1 disposed in the corresponding emission area EMA.

In an embodiment, a third insulating layer INS3 may be disposed in each emission area EMA provided with the first contact electrode CNE1. In an embodiment, the third insulating layer INS3 may be formed on the second insulating layer INS2 and the first contact electrode CNE1 that may be disposed in the corresponding emission area EMA.

In an embodiment, the second contact electrode CNE2 may be disposed in each emission area EMA provided with the third insulating layer INS3. In an embodiment, the second contact electrode CNE2 may be disposed on the second electrode ELT2 disposed in the corresponding emission area EMA to come into contact with a portion of the second electrode ELT2. Furthermore, the second contact electrode CNE2 may be disposed on the second end EP2 of at least one light emitting element LD disposed in the corresponding emission area EMA to come into contact with the second end EP2. Due to the second contact electrode CNE2, the second end EP2 of at least one light emitting element LD disposed in each emission area EMA may be electrically coupled to the second electrode ELT2 disposed in the corresponding emission area EMA.

A bank BNK may be disposed on the substrate SUB on which the first and second electrodes ELT1 and ELT2 may be formed. For instance, the bank BNK may be formed to enclose the pair of emission areas EMA corresponding to the pair of sub-pixels SPXp, respectively, thus forming a pixel defining layer that partitions each pair of emission areas EMA on the basis of the pair of sub-pixels SPXp.

In an embodiment, the bank BNK may be formed to have a height H2 that may be higher than a height H1 of the first and second partition walls PW1 and PW2. Such a bank BNK may function as a dam structure that prevents the LED solution SOL supplied to the pair of emission areas EMA corresponding to any pair of sub-pixels SPXp from being introduced into other adjacent emission areas EMA, or controls to supply an amount of solution to any pair of emission areas EMA, in the step of supplying the light emitting elements LD to respective emission areas EMA.

In an embodiment of the disclosure, any pair of sub-pixels SPXp may be composed of two sub-pixels SPX having the same color. Thus, the same type of LED solution SOL, e.g., a first LED solution SOL1 in which multiple first color light emitting elements LD1 is diffused may be supplied to the pair of emission areas EMA (e.g., two emission areas EMA) corresponding to any pair of sub-pixels SPXp. According to the embodiment, even if the pair of emission areas EMA may be enclosed by the bank BNK, a desired type of light emitting elements LD may be supplied to the pair of emission areas EMA.

Depending on embodiments, the bank BNK may have various shapes. In an embodiment, the bank BNK may have a curved section such as a semi-circular section or a semi-elliptical section, the width of which may be reduced towards the top, as illustrated in FIG. 12. In another embodiment, the bank BNK may have an inclined trapezoidal section, the width of which may be reduced towards the top, as illustrated in FIG. 13. In other words, in an embodiment, the bank BNK may have a shape in which a width may be reduced towards the top, and the shape may be changed in various ways.

A fourth insulating layer INS4 may be disposed on the substrate SUB on which the first and second electrodes ELT1 and ELT2, the light emitting elements LD, the first and second contact electrodes CNE1 and CNE2, and the bank BNK have been disposed. For example, the fourth insulating layer INS4 may be formed on the entirety of the display area DA to cover the upper surface of the substrate SUB on which the first and second electrodes ELT1 and ELT2, the light emitting elements LD, the first and second contact electrodes CNE1 and CNE2, and the bank BNK have been disposed. In an embodiment, the fourth insulating layer INS4 may not only include at least one inorganic layer and/or organic layer for protecting components of the display element layer LDL, e.g., an encapsulation layer, but may also include various functional layers, etc.

Figure 14:
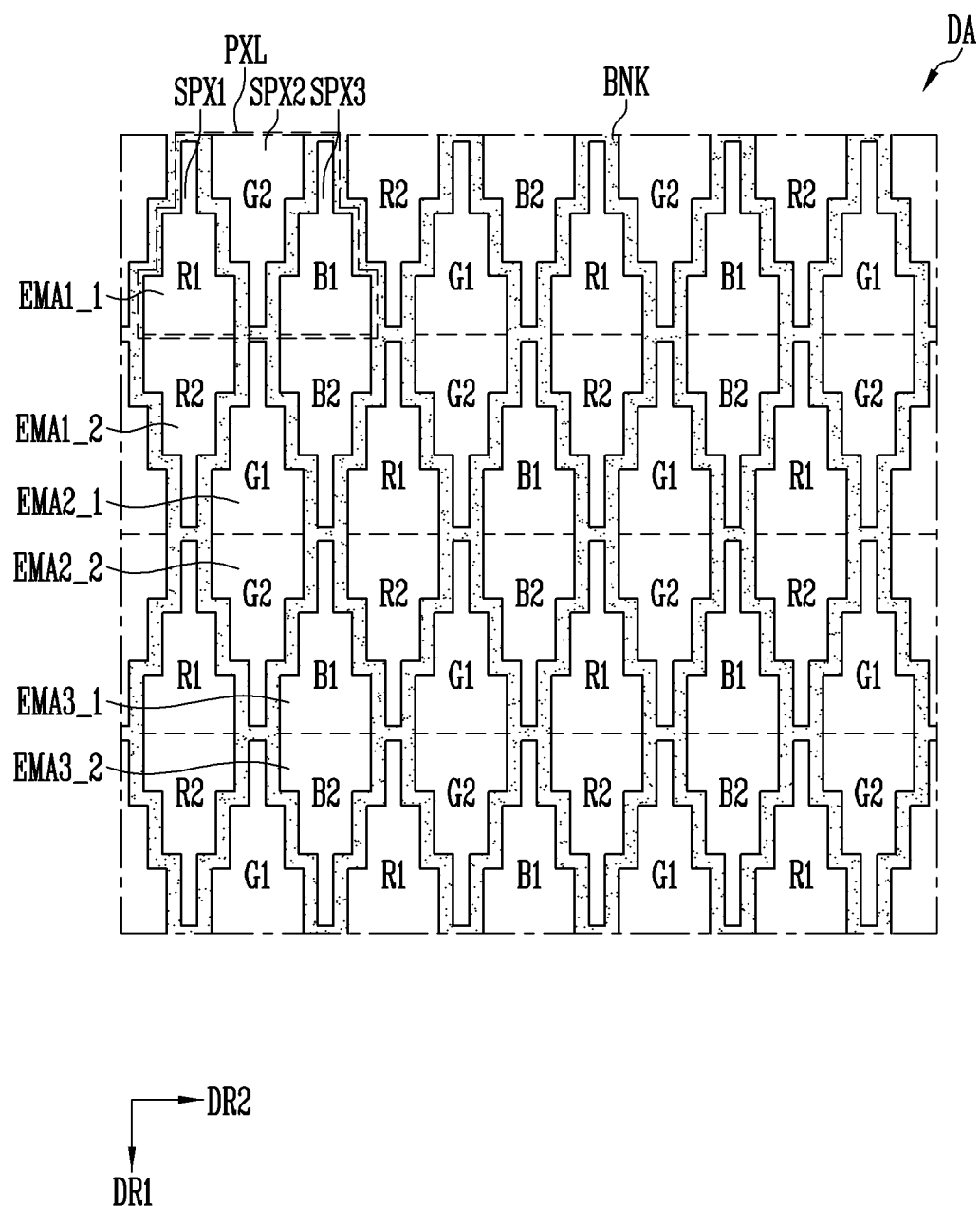
FIGS. 14 to 16 are schematic plan views each illustrating a display area in accordance with an embodiment of the disclosure.
Figure 15:
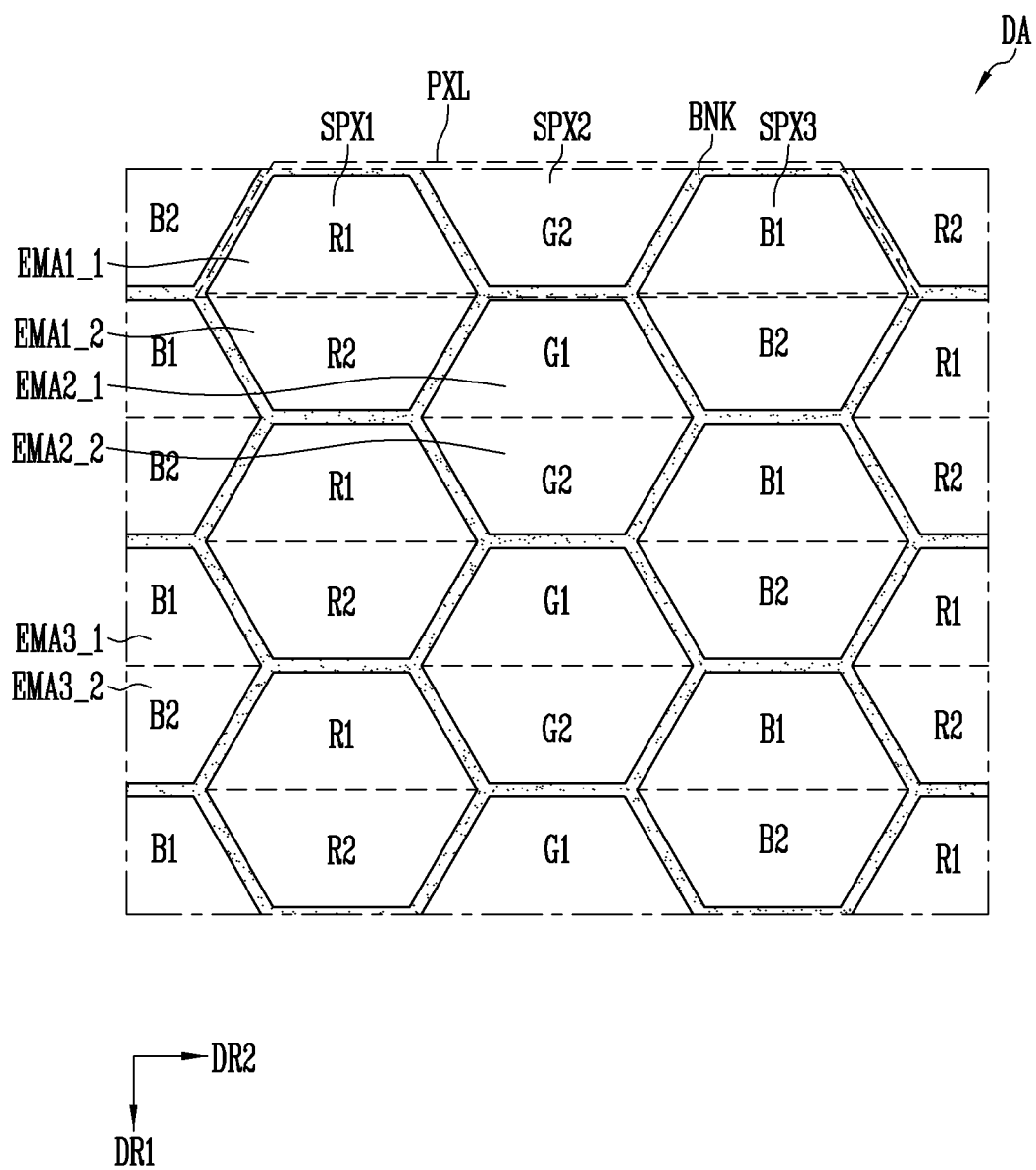
Figure 16:
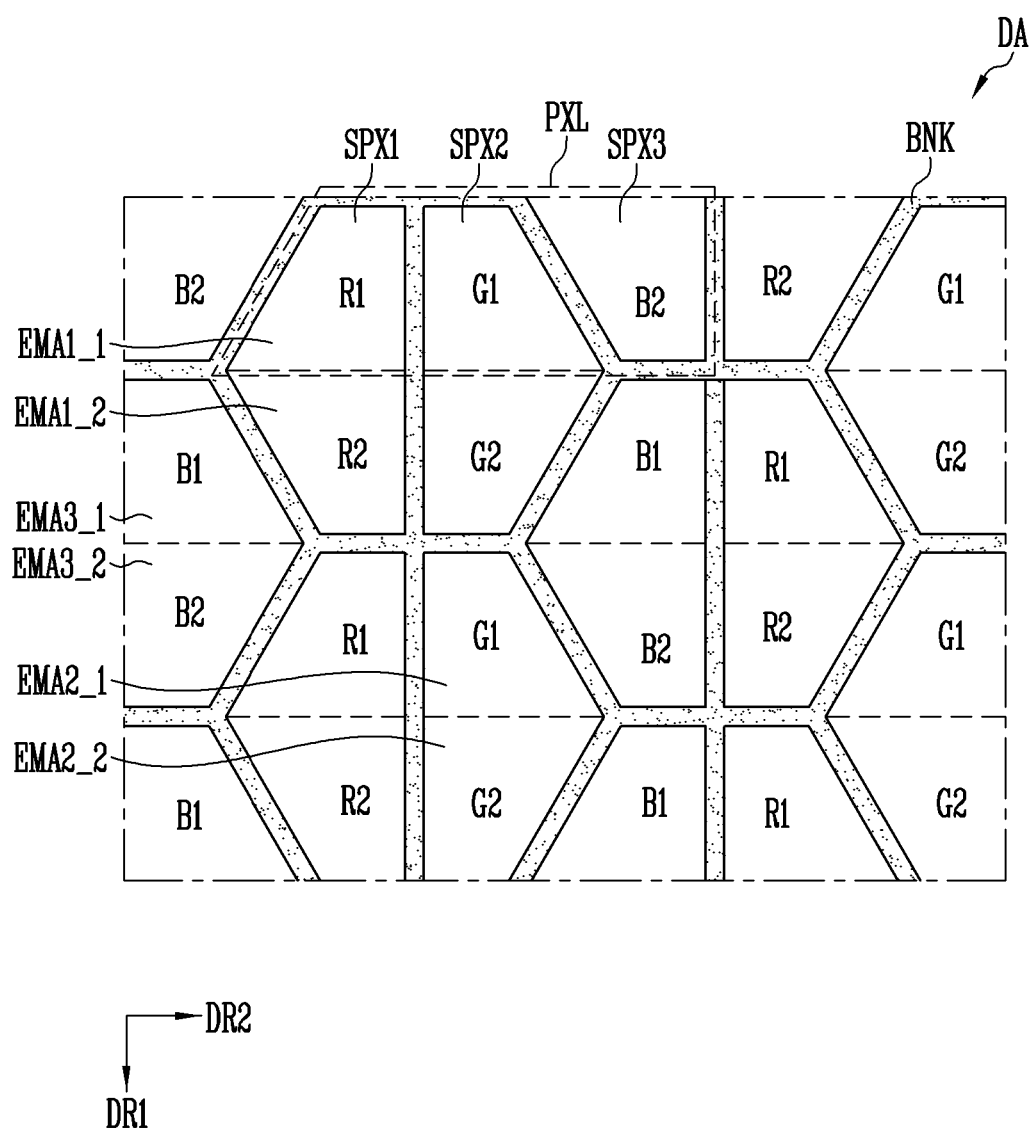

FIGS. 14 to 16 are schematic plan views each illustrating a display area DA in accordance with an embodiment of the disclosure. To be more specific, FIGS. 14 to 16 illustrate different embodiments related to the shape and arrangement structure of the sub-pixels SPX. For example, FIGS. 14 to 16 illustrate different modifications related to the embodiment of FIG. 8. In an embodiment of FIGS. 14 to 16, like reference numerals are used to designate the same or similar components as those of the embodiment of FIG. 8, and detailed descriptions thereof will be omitted.

Referring to FIGS. 14 to 16, the shape of each sub-pixel SPX and/or bank BNK may be changed in various ways. For example, as illustrated in FIG. 14, the emission area EMA of each sub-pixel SPX or at least one side of the emission area EMA may have a stepped shape. For instance, each emission area EMA may have a stepped shape having a different width in the second direction DR2 for each area in the first direction DR1. The first, second, and third color sub-pixels SPX1, SPX2, and SPX3 that may be continuously arranged in the second direction DR2 may form one pixel PXL. Furthermore, in this embodiment, the bank BNK may also have a stepped shape matching the shape of each sub-pixel SPX (particularly, the emission area EMA of the sub-pixel SPX). For instance, the bank BNK may be formed in a mesh pattern having stepped openings.

Furthermore, according to an embodiment, each sub-pixel SPX may have a polygonal shape other than a triangular shape. For example, as illustrated in FIG. 15, each sub-pixel SPX may have the emission area EMA of a polygonal shape, e.g., an isosceles trapezoidal shape having a symmetrical structure in the second direction DR2. The first, second, and third color sub-pixels SPX1, SPX2, and SPX3 that may be continuously arranged in the second direction DR2 may form one pixel PXL having a trapezoidal or an inverted trapezoidal shape.

Furthermore, the pair of sub-pixels SPX that may be completely enclosed by the bank BNK may be arranged to have a symmetrical structure in the first direction DR1. The bank BNK may have a polygonal shape, e.g., a hexagonal shape having a symmetrical structure in both the first direction DR1 and the second direction DR2. For example, the bank BNK may be formed in a mesh pattern including hexagonal openings.

Furthermore, in an embodiment, each sub-pixel SPX may be symmetrical with another neighboring sub-pixel SPX in the first direction DR1, and simultaneously may be symmetrical with another neighboring sub-pixel SPX in the second direction DR2. For instance, as illustrated in FIG. 16, assuming that the first, second, and third color sub-pixels SPX1, SPX2, and SPX3 that may be continuously arranged in the second direction DR2 form one pixel PXL, the second color sub-pixel SPX2 may have an emission area EMA2_1 or EMA2_2 having a shape where an emission area EMA1_1 or EMA1_2 of the first color sub-pixel SPX1 is inverted in the second direction DR2, and the third color sub-pixel SPX3 may have an emission area EMA3_1 or EMA3_2 having a shape where the emission area EMA2_1 or EMA2_2 of the second color sub-pixel SPX2 is inverted in the first direction DR1 and the second direction DR2. For instance, the first, second, and third color sub-pixels SPX1, SPX2, and SPX3 each may have the emission area EMA of a right-angled trapezoidal shape having a symmetrical structure in the first direction DR1 and/or the second direction DR2. The bank BNK may have a pentagonal shape having a symmetrical structure in the first direction DR1. For instance, the bank BNK may be formed in a mesh pattern including pentagonal openings, and two openings that are adjacent to each other in the first direction DR1 may be symmetrical with each other in the first direction DR1. Furthermore, a pair of openings that may be adjacent to each other in the second direction DR2 may be symmetrical with each other in the second direction DR2.

As described above, the display device according to various embodiments of the disclosure may include multiple sub-pixels SPX each having various polygonal shapes such as a triangular shape (or an inverted triangular shape) or a trapezoidal shape (or an inverted trapezoidal shape), or a stepped shape based thereon. Furthermore, each sub-pixel SPX may be disposed to be symmetrical (e.g., top and bottom symmetrical) in the first direction DR1 with another sub-pixel SPX of the same color that is adjacent in the first direction DR1. The bank BNK may have a shape that may completely enclose the pair of sub-pixels SPX of the same color (particularly, the emission areas EMA thereof), e.g., various polygonal shapes such as a diamond shape having a top and bottom symmetrical structure in the first direction DR1 or a stepped shape based thereon.

According to the embodiments of the disclosure, the sub-pixels SPX may be divided into smaller sizes to be compactly arranged in the display area DA, while securing the widths of the sub-pixels SPX sufficient to accommodate the droplet DRL including the light emitting elements LD. Thus, a display device having high resolution may be realized.

Furthermore, in an embodiment of the disclosure, each pixel PXL may form each unit light emitting device, and each sub-pixel SPX may form each sub-light emitting unit. For instance, the first color sub-pixel SPX1 may form a first color sub-light emitting unit, the second color sub-pixel SPX2 may form a second color sub-light emitting unit, and the third color sub-pixel SPX3 may form a third color sub-light emitting unit. Furthermore, a full-color pixel PXL including the first to third color sub-pixels SPX1, SPX2, and SPX3 may form a full-color unit light emitting device. In other words, the embodiment of the disclosure may be applied to a display device, but the applicable range of the disclosure is not limited to the display device. For example, the embodiment of the disclosure may be widely applied to other types of devices requiring a light source.

While the spirit and scope of the disclosure are described by detailed embodiments, it should be noted that the above-described embodiments are merely descriptive and should not be considered limiting. It should be understood by those skilled in the art that various changes, substitutions, and alterations may be made herein without departing from the scope of the disclosure as defined by the following claims and equivalents thereof.

What is claimed is:

1. A display device, comprising:
    a pair of first color sub-pixels arranged in a display area in a first direction, each first color sub-pixel of the pair of first color sub-pixels including at least two first color light emitting elements; and
    a bank enclosing the pair of first color sub-pixels, wherein
    the bank comprises at least two areas having different widths in an area corresponding to each of the pair of first color sub-pixels, and
    the bank is not disposed between each first color sub-pixel of the pair of first color sub-pixels.

2. The display device according to claim 1, wherein the pair of first color sub-pixels comprise at least two areas having different widths in each emission area enclosed by the bank, the at least two areas of the pair of first color sub-pixels contacting each other in a portion of the emission area having a maximum width.

3. The display device according to claim 1, wherein
    the first direction is a vertical direction of the display area, and
    the bank has a top and bottom symmetrical shape.

4. The display device according to claim 1, wherein
    the pair of first color sub-pixels comprise emission areas having a triangular shape and an inverted triangular shape, respectively, and
    the bank has a quadrilateral shape enclosing only the emission areas of the pair of first color sub-pixels.

5. The display device according to claim 4, wherein
    the pair of first color sub-pixels are symmetrically arranged in the first direction, each of the pair of first color sub-pixels has an emission area of an isosceles triangular shape, and
    the bank has a diamond shape and encloses the emission areas of the pair of first color sub-pixels.

6. The display device according to claim 1, wherein
    each of the pair of first color sub-pixels comprises a polygonal emission area having a symmetrical structure in a second direction intersecting the first direction, and
    the bank has a polygonal shape having a symmetrical structure in the first direction and the second direction.

7. The display device according to claim 1, wherein each of the pair of first color sub-pixels comprises a step-shaped emission area.

8. The display device according to claim 1, further comprising:
    a second color sub-pixel disposed adjacent to at least one of the pair of first color sub-pixels in a second direction intersecting with the first direction, and including at least two second color light emitting elements; and
    a third color sub-pixel disposed adjacent to the second color sub-pixel in the second direction, and including at least two third color light emitting elements.

9. The display device according to claim 8, wherein
    the second color sub-pixel comprises an emission area having a shape in which an emission area of the at least one of the pair of first color sub-pixels is inverted in the first direction, and
    the third color sub-pixel comprises an emission area having the same shape as the emission area of the at least one of the pair of first color sub-pixels.

10. The display device according to claim 8, wherein
    the second color sub-pixel is disposed between the at least one of the pair of first color sub-pixels and the third color sub-pixel,
    an emission area of the at least one of the pair of first color sub-pixels and an emission area of the third color sub-pixel have a triangular shape, and
    an emission area of the second color sub-pixel has an inverted triangular shape.

11. The display device according to claim 10, comprising a trapezoidal pixel including the at least one of the pair of first color sub-pixels, the second color sub-pixel, and the third color sub-pixel.

12. The display device according to claim 8, wherein
the second color sub-pixel comprises an emission area having a shape in which an emission area of the at least one of the pair of first color sub-pixels is inverted in the second direction, and
the third color sub-pixel comprises an emission area having a shape in which the emission area of the second color sub-pixel is inverted in the first direction and the second direction.

13. The display device according to claim 1, wherein each of the pair of first color sub-pixels further comprises:
a first electrode disposed in each emission area, and electrically connected only to a first end of each of the at least two first color light emitting elements; and
a second electrode disposed in each emission area to be spaced apart from the first electrode, and electrically connected only to a second end of each of the at least two first color light emitting elements, wherein
the second end is opposite from the first end for each of the at least two first color light emitting elements.

14. The display device according to claim 13, wherein
the first electrodes disposed in the pair of first color sub-pixels have a same shape, and
the second electrodes disposed in the pair of first color sub-pixels have a same shape.

15. The display device according to claim 13, wherein
the first electrodes disposed in the pair of first color sub-pixels are symmetrical with each other, and
the second electrodes disposed in the pair of first color sub-pixels are symmetrical with each other.

16. The display device according to claim 13, wherein
the first electrodes of the pair of first color sub-pixels are separated from each other, and
the second electrodes of the pair of first color sub-pixels are electrically connected to each other.

17. The display device according to claim 13, wherein each of the pair of first color sub-pixels further comprises:
a first partition wall disposed between a substrate and the first electrode;
a second partition wall disposed between the substrate and the second electrode;
a first contact electrode disposed on the first end of each of the at least two first color light emitting elements and a portion of the first electrode, the first contact electrode electrically connecting the first end of each of the at least two first color light emitting elements to the first electrode; and
a second contact electrode disposed on the second end of each of the at least two first color light emitting elements and a portion of the second electrode, the second contact electrode electrically connecting the second end of each of the at least two first color light emitting elements to the second electrode.

18. The display device of claim 1, wherein a boundary between ones of the pair of first color sub-pixels is absent of any light emitting elements.

19. The display device of claim 1, wherein in each of the at least two first color light emitting elements, any one of the pair of first color sub-pixels are electrically connected in parallel and are spaced apart from each other.

20. The display device of claim 1, wherein ones of the pair of first color sub-pixels are independently addressed and independently controlled.

21. A display device, comprising:
a pair of emission areas arranged in a display area and contacting each other, the pair of emission areas each including:
a first electrode;
a second electrode; and
at least two first color light emitting elements disposed between the first electrode and the second electrode; and
a bank enclosing the pair of emission areas, wherein
the bank comprises at least two areas having different widths in an area corresponding to each of the pair of emission areas, and has a maximum width in an area where the emission areas contact each other,
each light emitting element of the at least two first color light emitting elements is electrically connected in parallel and is spaced apart from each other, and
each emission area of the pair of emission areas is independently addressed and independently controlled.

22. The display device according to claim 21, wherein
the pair of emission areas vertically contact with each other in the display area, and
the bank has a top and bottom symmetrical shape.

23. The display device according to claim 21, wherein the first electrodes of the pair of emission areas are separated from each other.

* * * * *